United States Patent
Fujita et al.

(10) Patent No.: US 10,199,243 B2
(45) Date of Patent: Feb. 5, 2019

(54) SUBSTRATE PROCESSING METHOD AND SUBSTRATE PROCESSING APPARATUS

(71) Applicant: SCREEN Holdings Co., Ltd., Kyoto (JP)

(72) Inventors: Kazuhiro Fujita, Kyoto (JP); Atsuyasu Miura, Kyoto (JP); Hiroki Tsujikawa, Kyoto (JP); Yuya Tsuchihashi, Kyoto (JP); Akihiko Taki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/831,924

(22) Filed: Dec. 5, 2017

(65) Prior Publication Data

US 2018/0158698 A1 Jun. 7, 2018

(30) Foreign Application Priority Data

Dec. 7, 2016 (JP) .................. 2016-237804

(51) Int. Cl.
| | |
|---|---|
| H01L 21/67 | (2006.01) |
| B08B 3/10 | (2006.01) |
| H01L 21/306 | (2006.01) |
| H01L 21/02 | (2006.01) |

(52) U.S. Cl.
CPC ........... *H01L 21/6708* (2013.01); *B08B 3/10* (2013.01); *H01L 21/02041* (2013.01); *H01L 21/30604* (2013.01); *H01L 21/67023* (2013.01); *H01L 21/67028* (2013.01); *H01L 21/67075* (2013.01); *H01L 21/67109* (2013.01)

(58) Field of Classification Search
None
See application file for complete search history.

(56) References Cited

U.S. PATENT DOCUMENTS

| | | | |
|---|---|---|---|
| 2013/0048609 A1* | 2/2013 | Ito .................... | H01L 21/67051 216/83 |
| 2015/0270145 A1 | 9/2015 | Inoue et al. | |
| 2016/0268146 A1 | 9/2016 | Kobayashi | |

FOREIGN PATENT DOCUMENTS

| | | |
|---|---|---|
| JP | 2015-185644 A | 10/2015 |
| JP | 2016-167568 A | 9/2016 |

* cited by examiner

*Primary Examiner* — Jiong-Ping Lu
(74) *Attorney, Agent, or Firm* — Ostrolenk Faber LLP

(57) ABSTRACT

A substrate processing method is a substrate processing method which applies sequentially common etching processing which is common to each of a plurality of substrates. The common etching processing has an etching step and a high-temperature liquid discharge step. The substrate processing method further includes a piping heating step in which, of the plurality of common etching processings applied to the plurality of substrates, before the initial common etching processing, the pipe wall of the common piping is raised in temperature up to a predetermined second liquid temperature higher than a first liquid temperature and in each of the common etching processings, after each of high-temperature liquid discharge steps and before each of next etching steps, there is not performed a step in which the pipe wall of the common piping is lowered in temperature.

12 Claims, 18 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus which process a substrate. Substrates to be processed include, for example, semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

Japanese Unexamined Patent Application Publication No. 2015-185644 describes a single substrate processing type substrate processing apparatus which applies etching substrates one by one is disclosed in. In the etching processing according to the substrate processing apparatus, an etching liquid is supplied to upper and lower surfaces of a substrate which is rotated in a horizontal posture by a spin chuck (etching process). After completion of the etching process, a rinse liquid is supplied to the upper and lower surfaces of the substrate, by which the etching liquid adhered on the upper and lower surfaces of the substrate is washed away. Organic solvents such as isopropyl alcohol: IPA, etc., are supplied onto the upper surface of the substrate after processing by the rinse liquid (organic solvent supplying process). The rinse liquid on the upper surface of the substrate is substituted with an organic solvent by the organic solvent supplying process. Thereafter, the substrate is rotated at a high speed in a spin dry process, by which the rinse liquid adhered on the substrate is removed (spun-off) by being separated and scattered.

The substrate processing apparatus according to Japanese Unexamined Patent Application Publication No. 2015-185644 given below includes a lower surface nozzle which discharges a processing liquid toward a lower surface central portion of a substrate, processing liquid piping which is connected to the lower surface nozzle, an etching liquid unit which supplies an etching liquid kept at a normal temperature to the processing liquid piping and a heated liquid unit which supplies to the processing liquid piping a heated liquid heated to a high temperature. The processing liquid piping selectively supplies the etching liquid at a normal temperature and the heated liquid to the lower surface nozzle.

In the above-described substrate processing apparatus, heat derived from the heated liquid is accumulated on a pipe wall of the processing liquid piping during the organic solvent supplying process. Therefore, where etching processing is continuously performed for a plurality of substrates, there is a possibility that the pipe wall of the processing liquid piping may be raised in temperature as the etching processing is repeated, thus resulting in a possible rise in temperature of the etching liquid discharged from the lower surface nozzle. In Japanese Unexamined Patent Application Publication No. 2015-185644, a coolant is supplied to the processing liquid piping at completion of each etching process, thereby cooling the pipe wall of the processing liquid piping so as to eliminate the above-described thermal effects.

SUMMARY OF THE INVENTION

However, it is difficult to completely eliminate heat accumulated in the processing liquid piping by the method described in Japanese Unexamined Patent Application Publication No. 2015-185644. Therefore, when etching processing is continuously applied to a plurality of substrates, the pipe wall of the processing liquid piping is raised in temperature, as the etching processing is repeated and, as a result, there is a possibility that the etching liquid discharged from the lower surface nozzle may be raised in temperature.

FIG. 19 is a graph which describes a relationship between the number of sheets of substrates to be processed by etching and a temperature of an etching liquid discharged from the lower surface nozzle. Where etching processing is continuously applied to a plurality of substrates, the etching liquid is initially discharged from the lower surface nozzle, while a temperature TA of the etching liquid fed to the processing liquid piping is kept as it is. However, as the etching processing is repeated (with an increase in the number of sheets of substrates subjected to the etching processing), the etching liquid discharged is raised in temperature. An etching rate applied to a substrate is proportional to a temperature of the etching liquid discharged and, therefore, the etching rate may be raised as the etching processing is repeated.

Further, this is not limited to a method by which warm water is supplied to the rear surface as disclosed in Japanese Unexamined Patent Application Publication No. 2015-185644, but this is a common problem found where warm water is used as a rinse liquid for a substrate.

That is, where etching processing is applied to a plurality of substrates, it is required to suppress or prevent a variation in etching processing between substrates which is derived from the above-described thermal effects.

Therefore, an object of the present invention is to provide a substrate processing method and a substrate processing apparatus which are capable of suppressing or preventing a variation in etching processing between substrates.

The present invention is to provide a substrate processing method which is executed by a substrate processing apparatus that includes a nozzle for supplying a liquid to a substrate held by a substrate holding unit and common piping which is connected to the nozzle and which applies sequentially common etching processing which is common to each of the plurality of substrates, and each of the common etching processing includes an etching step in which an etching liquid at a predetermined first liquid temperature is supplied to the common piping to discharge the etching liquid from the nozzle, thereby etching the substrate held by the substrate holding unit and a high-temperature liquid discharge step in which a high-temperature liquid having a liquid temperature higher than the first liquid temperature is supplied to the common piping after the etching step to discharge the high-temperature liquid from the nozzle, and the substrate processing method further includes a piping heating step in which, of the plurality of common etching processings performed for the plurality of substrates, before initial common etching processing, a pipe wall of the common piping is raised in temperature up to a predetermined second liquid temperature higher than the first liquid temperature, and in each of the common etching processing, after each of the high-temperature liquid discharge steps and before each of next etching steps, there is not performed a step for lowering a temperature of the pipe wall of the common piping.

According to the above-described method, of the plurality of common etching processings, before the initial common etching processing, the pipe wall of the common piping is raised in temperature up to the second liquid temperature which is higher than a liquid temperature of the etching liquid supplied to the nozzle. Further, after each of the high-temperature liquid discharge steps and before each of the next etching steps, the pipe wall of the common piping is not lowered in temperature.

Since the pipe wall of the common piping is raised in temperature up to the second liquid temperature before initial common etching processing, it is possible to etch a substrate by using an etching liquid at the second liquid temperature higher than the first liquid temperature from an etching step according to the initial common etching processing. Then, heat accumulation in the common piping during the high-temperature liquid discharge step according to the common etching processing makes it possible to keep a liquid temperature of the etching liquid used in the etching step according to subsequent common etching processing higher than the first liquid temperature. It is, thereby, possible to apply etching processing to a plurality of substrates in each of the etching steps at a similar or an approximate etching rate and at a stable etching rate. It is, thus, possible to suppress or prevent a variation in etching processing between the substrates.

In one preferred embodiment of the present invention, the substrate processing apparatus further includes a recipe storage portion for storing a process recipe which specifies processing contents applied to a substrate and a pre-recipe which is executed prior to the process recipe. In this case, a first recipe corresponding to the common etching processing and a second recipe corresponding to the piping heating step may be stored respectively as the process recipe and the pre-recipe at the recipe storage portion. Then, the common etching processings may be executed on the basis of the first recipe and the piping heating step may also be executed on the basis of the second recipe.

According to the above-described method, the common etching processing is executed on the basis of the first recipe stored at the recipe storage portion and the piping heating step is also executed on the basis of the second recipe stored at the recipe storage portion. Therefore, of the plurality of common etching processings, before execution of the initial common etching processing, the piping heating step can be realized relatively easily.

Further, the common etching processing may be a process which is executed for each of a plurality of substrates which constitute one lot.

According to the above-described method, etching processing can be applied to each of a plurality of substrates which constitute one lot at a similar or an approximate etching rate. It is, therefore, possible to suppress or prevent a variation in etching processing between a plurality of substrates which constitute one lot.

In the substrate processing apparatus, following the plurality of substrates which constitute the one lot, a plurality of substrates which constitute a next lot may be processed. In this case, where the common etching processing is executed for the plurality of substrates which constitute the one lot and the common etching processing is also executed for the plurality of substrates which constitute the next lot, the piping heating step may not be performed for the next lot.

According to the above-described method, where the common etching processing is executed not only for a plurality of substrates which constitute one lot but also for a plurality of substrates which constitute a next lot, the piping heating step executed for the next lot is cancelled. Therefore, it is possible to keep a liquid temperature of the etching liquid higher than the first liquid temperature from the etching step of a next lot according to the initial common etching processing. Thereby, etching processing can be applied to a plurality of substrates which constitute a next lot at a similar or an approximate etching rate. Therefore, it is possible to suppress or prevent a variation in etching processing between a plurality of substrates which constitute a next lot.

The above-described method may further include a piping cooling step in which, of the plurality of common etching processings applied to the plurality of substrates, after the last common etching processing, the common piping is cooled to lower a temperature of the pipe wall of the common piping. In this case, in the substrate processing apparatus, following the plurality of substrates which constitute the one lot, a plurality of substrates which constitute a next lot are to be processed. Then, where the common etching processing is executed for the plurality of substrates which constitute the one lot and the common etching processing is also executed for the plurality of substrates which constitute the next lot, the piping cooling step may not be performed for the one lot.

According to the above-described method, where the common etching processing is executed not only for a plurality of substrates which constitute one lot but also for a plurality of substrates which constitute a next lot, the piping cooling step executed for one lot is cancelled. Therefore, it is possible to keep a liquid temperature of the etching liquid higher than the first liquid temperature from the etching step of a next lot according to the initial common etching processing. Thereby, etching processing can be applied to a plurality of substrates which constitute a next lot at a similar or an approximate etching rate. Therefore, it is possible to suppress or prevent a variation in etching processing between a plurality of substrates which constitute a next lot.

The second liquid temperature is a temperature of the pipe wall of the common piping and may be a thermal equilibrium temperature which will converge (in thermodynamic equilibrium) upon continuous execution of the common etching processing in the substrate processing apparatus.

According to the above-described method, it is possible to etch a substrate by using an etching liquid at a thermal equilibrium temperature from the etching step according to the initial common etching processing. Then, heat accumulation in the common piping during the high-temperature liquid discharge step according to the common etching processing makes it possible to keep a liquid temperature of the etching liquid used in the etching step according to subsequent common etching processing at a thermal equilibrium temperature. That is, it is possible to keep constant a liquid temperature of the etching liquid used in the etching step according to each of the common etching processing. Thereby, etching processing can be applied to a plurality of substrates at the same etching rate in each etching step. Therefore, it is possible to suppress or prevent a variation in etching processing between the substrates.

The piping heating step may include a heated-liquid circulation step which circulates through the common piping a heated liquid having a temperature equal to the second liquid temperature or higher than the second liquid temperature so that the common piping can be heated.

According to the above-described method, the heated liquid is circulated through the common piping, by which the pipe wall of the common piping can be favorably raised in temperature.

The piping heating step may include a heating step which heats the common piping so that the pipe wall of the common piping can be raised in temperature higher than the second liquid temperature and a temperature adjusting step which cools the common piping after the heating step to adjust a temperature of the common piping to the second liquid temperature.

According to the above-described method, after the common piping is temporarily raised in temperature higher than the second liquid temperature, the common piping is cooled to bring a temperature of the common piping close to the second liquid temperature. In this way, the temperature is adjusted in stages, thus making it possible to favorably adjust the temperature of the common piping to the second liquid temperature.

The above-described method may further include a piping cooling step in which, of the plurality of common etching processings applied to the plurality of substrates, after the last common etching processing, the common piping is cooled to lower a temperature of the pipe wall of the common piping.

According to the above-described method, of the plurality of common etching processings, after the last common etching processing, the piping cooling step is executed. Since the pipe wall of the common piping is lowered in temperature (to the first temperature, for example) after the last common etching processing, it is possible to reset heat accumulated in the common piping during the common etching processing and the piping heating step. It is, thereby, possible to favorably execute next processing which is executed in the substrate processing apparatus, while thermal effects are avoided in the piping heating step according to the plurality of common etching processing.

The substrate processing apparatus may include a recipe storage portion for storing a process recipe which specifies processing contents applied to a substrate, a pre-recipe which is executed prior to the process recipe and a post-recipe which is executed after the process recipe. A first recipe corresponding to the common etching processing, a second recipe corresponding to the piping heating step and a third recipe corresponding to the piping cooling step may be stored respectively as the process recipe, the pre-recipe and the post-recipe at the recipe storage portion. The common etching processing may be executed on the basis of the first recipe, the piping heating step may be executed on the basis of the second recipe, and the piping cooling step may also be executed on the basis of the third recipe.

According to the above-described method, the common etching processing is executed on the basis of the first recipe stored at the recipe storage portion, the piping heating step is executed on the basis of the second recipe stored at the recipe storage portion, and the piping cooling step is also executed on the basis of the third recipe stored at the recipe storage portion. Therefore, of the plurality of common etching processings, after the last common etching processing, the piping cooling step can be realized relatively easily.

The piping cooling step may include a coolant circulation step which circulates a coolant having a temperature lower than the second liquid temperature through the common piping so that the common piping can be cooled.

According to the above-described method, the coolant is circulated through the common piping, by which the pipe wall of the common piping can be favorably lowered in temperature.

The piping cooling step may include an external cooling step which cools the common piping from the exterior so that the common piping can be cooled.

According to the above-described method, the common piping is cooled from the exterior, by which the pipe wall of the common piping can be favorably lowered in temperature.

The present invention is to provide a substrate processing apparatus which includes a substrate holding unit that holds a substrate, a nozzle that supplies a liquid to the substrate held by the substrate holding unit, common piping that is connected to the nozzle, an etching liquid supplying unit which supplies to the common piping an etching liquid at a predetermined first liquid temperature, a high-temperature liquid supplying unit which supplies to the common piping a high-temperature liquid having a liquid temperature higher than the first liquid temperature, a piping heating unit for heating the common piping, and a controller which controls the etching liquid supplying unit, the heated-liquid supplying unit and the piping heating unit, in which the controller executes common etching processing which applies the common processing sequentially to each of a plurality of substrates, which is one unit composed of a predetermined number of sheets thereof, that is, the common etching processing which includes an etching step in which an etching liquid having a first liquid temperature is supplied to the common piping to discharge the etching liquid from the nozzle, thereby etching the substrate held by the substrate holding unit and a high-temperature liquid discharge step in which a high-temperature liquid having a liquid temperature higher than the first liquid temperature is supplied after the etching step to the common piping, thereby discharging the high-temperature liquid from the nozzle, and the controller further executes a piping heating step in which, of the plurality of common etching processings applied to the plurality of substrates, before initial common etching processing, the pipe wall of the common piping is raised in temperature up to a predetermined second liquid temperature higher than the first liquid temperature, and in the common etching processing, the controller will not execute a step in which the pipe wall of the common piping is lowered in temperature after each of the high-temperature liquid discharge steps and before each of the next etching steps.

According to the above-described configuration, of the plurality of common etching processings, before the initial common etching processing, the pipe wall of the common piping is raised in temperature up to the second liquid temperature higher than a liquid temperature of the etching liquid supplied to the nozzle. Further, after each of the high-temperature liquid discharge steps and before each of the next etching steps, the pipe wall of the common piping is not lowered in temperature.

Since the pipe wall of the common piping is raised in temperature up to the second liquid temperature before the initial common etching processing, it is possible to etch a substrate by using an etching liquid having the second liquid temperature higher than the first liquid temperature from the etching step according to the initial common etching processing. Then, heat accumulation in the common piping during the high-temperature liquid discharge step according to the common etching processing makes it possible to keep a liquid temperature of the etching liquid used in the etching step according to subsequent common etching processing higher than the first liquid temperature. It is, thereby, possible to apply etching processing to a plurality of substrates at a similar or an approximate etching rate and at a stable etching rate for each of the etching steps. Therefore, it is possible to suppress or prevent a variation in etching processing between the substrates.

In one preferred embodiment of the present invention, the substrate processing apparatus further includes a recipe storage portion which stores a process recipe for specifying processing contents applied to a substrate and a pre-recipe executed prior to the process recipe. A first recipe corresponding to the common etching processing and a second recipe corresponding to the piping heating step may be stored respectively as the process recipe and the pre-recipe at the recipe storage portion. The controller may execute the common etching processing on the basis of the first recipe and may also execute the piping heating step on the basis of the second recipe.

According to the above-described configuration, the common etching processing is executed on the basis of the first recipe stored at the recipe storage portion and also the piping heating step is executed on the basis of the second recipe stored at the recipe storage portion. Therefore, of the plurality of common etching processings, before execution of the initial common etching processing, the piping heating step can be realized relatively easily.

Further, the controller may execute the common etching processing for each of a plurality of substrates which constitute one lot.

According to the above-described configuration, etching processing can be applied to each of a plurality of substrates which constitute one lot at a similar or an approximate etching rate. Therefore, it is possible to suppress or prevent a variation in etching processing between a plurality of substrates which constitute one lot.

In the substrate processing apparatus, following the plurality of substrates which constitute the one lot, a plurality of substrates which constitute a next lot may be processed. In this case, where the common etching processing is executed for the plurality of substrates which constitute the one lot and the common etching processing is also executed for the plurality of substrates which constitute the next lot, the controller may not perform the piping heating step for the next lot.

According to the above-described configuration, where the common etching processing is executed not only for a plurality of substrates which constitute one lot but also for a plurality of substrates which constitute a next lot, the piping heating step executed for the next lot is cancelled. Therefore, it is possible to keep a liquid temperature of an etching liquid higher than the first liquid temperature from the etching step of the next lot according to the initial common etching processing. Thereby, etching processing can be applied to a plurality of substrates which constitute a next lot at a similar or an approximate etching rate. Therefore, it is possible to suppress or prevent a variation in etching processing between a plurality of substrates which constitute a next lot.

In the substrate processing apparatus, following the plurality of substrates which constitute the one lot, a plurality of substrates which constitute a next lot may be processed. In this case, the controller may further execute a piping cooling step in which, of the plurality of common etching processings applied to the plurality of substrates, after the last common etching processing, the common piping is cooled, by which the pipe wall of the common piping is lowered in temperature. In this case, where the common etching processing is executed for the plurality of substrates which constitute the one lot and the common etching processing is also executed for the plurality of substrates which constitute the next lot, the controller may not perform the piping cooling step for the one lot.

According to the above-described configuration, where the common etching processing is executed not only for a plurality of substrates which constitute one lot but also for a plurality of substrates which constitute a next lot, the piping cooling step executed for one lot is cancelled. Therefore, it is possible to keep a liquid temperature of an etching liquid higher than the first liquid temperature from the etching step of a next lot according to the initial common etching processing. Thereby, etching processing can be applied to a plurality of substrates which constitute a next lot at a similar or an approximate etching rate. Therefore, it is possible to suppress or prevent a variation in etching processing between a plurality of substrates which constitute a next lot.

The second liquid temperature is a temperature of the pipe wall of the common piping and may be a thermal equilibrium temperature which will converge upon continuous execution of the common etching processing in the substrate processing apparatus.

According to the above-described configuration, an etching liquid having a thermal equilibrium temperature can be used to etch a substrate from the etching step according to the initial common etching processing. Then, heat accumulation in the common piping during the high-temperature liquid discharge step according to the common etching processing makes it possible to keep a liquid temperature of the etching liquid used in the etching step according to subsequent common etching processing at a thermal equilibrium temperature. That is, it is possible to keep constant a liquid temperature of the etching liquid used in the etching step according to each of the common etching processing. Thereby, etching processing can be applied to a plurality of substrates at the same etching rate for each of the etching steps. Therefore, it is possible to suppress or prevent a variation in etching processing between substrates.

The controller may execute, as the piping heating step, a heated-liquid circulation step in which a heated liquid having a temperature higher than the second liquid temperature is circulated through the common piping so that the common piping can be heated.

According to the above-described configuration, the heated liquid is circulated through the common piping, by which the pipe wall of the common piping can be favorably raised in temperature.

Further, the controller may execute a heating step which heats the common piping so that the pipe wall of the common piping can be raised in temperature higher than the second liquid temperature in the piping heating step and a temperature adjusting step in which the common piping is cooled after the heating step to adjust a temperature of the common piping to the second liquid temperature.

According to the above-described configuration, after the common piping is temporarily raised in temperature higher than the second liquid temperature, the common piping is cooled, thereby bringing a temperature of the common piping close to the second liquid temperature. In this way, the temperature is adjusted in stages, thus making it possible to favorably adjust the temperature of the common piping to the second liquid temperature.

The substrate processing apparatus may be further included a piping cooling unit for cooling the common piping. In this case, the controller may also control the piping cooling unit and the controller may execute a piping cooling step in which, of the plurality of common etching processings applied to the plurality of substrates, after the last common etching processing, the common piping is cooled to lower a temperature of the pipe wall of the common piping.

According to the above-described configuration, of the plurality of common etching processings, after the last common etching processing, the piping cooling step is executed. Since the pipe wall of the common piping is lowered in temperature (the first temperature, for example) after the last common etching processing, it is possible to reset the heat accumulated in the common piping during the common etching processing and the piping heating step. It is, thereby, possible to favorably execute next processing performed by the substrate processing apparatus, while avoiding thermal effects by the piping heating step according to the plurality of common etching processings.

The substrate processing apparatus may be further included a recipe storage portion which stores a process recipe for specifying processing contents applied to a substrate, a pre-recipe executed prior to the process recipe and a post-recipe executed after the process recipe. In this case, a first recipe corresponding to the common etching processing, a second recipe corresponding to the piping heating step and a third recipe corresponding to the piping cooling step are stored respectively as the process recipe, the pre-recipe and the post-recipe at the recipe storage portion. The controller may execute the common etching processing on the basis of the first recipe, may execute the piping heating step on the basis of the second recipe and may also execute the piping cooling step on the basis of the third recipe.

According to the above-described configuration, the common etching processing is executed on the basis of the first recipe stored at the recipe storage portion, the piping heating step is executed on the basis of the second recipe stored at the recipe storage portion, and the piping cooling step is also executed on the basis of the third recipe stored at the recipe storage portion. Therefore, of the plurality of common etching processings, after execution of the last common etching processing, the piping cooling step can be realized relatively easily.

Further, the piping cooling unit may include a coolant supplying unit which supplies to the common piping a coolant having a temperature lower than the second liquid temperature. In this case, the controller may execute, as the piping cooling step, a coolant circulation step which circulates the coolant through the common piping so as to cool the common piping.

According to the above-described configuration, the pipe wall of the common piping can be favorably lowered in temperature by circulating the coolant through the common piping.

Further, the piping cooling unit may include an external cooling unit which cools the common piping from the exterior. In this case, the controller may execute, as the piping cooling step, an external cooling step which cools the common piping by using the external cooling unit.

According to the above-described configuration, the pipe wall of the common piping can be favorably lowered in temperature by cooling the common piping from the exterior.

The above and other objects, features and effects of the present invention will become more apparent from the following detailed description of the preferred embodiments with reference to the attached drawings.

DETAILED DESCRIPTION OF PREFERRED EMBODIMENTS

Figure 1:
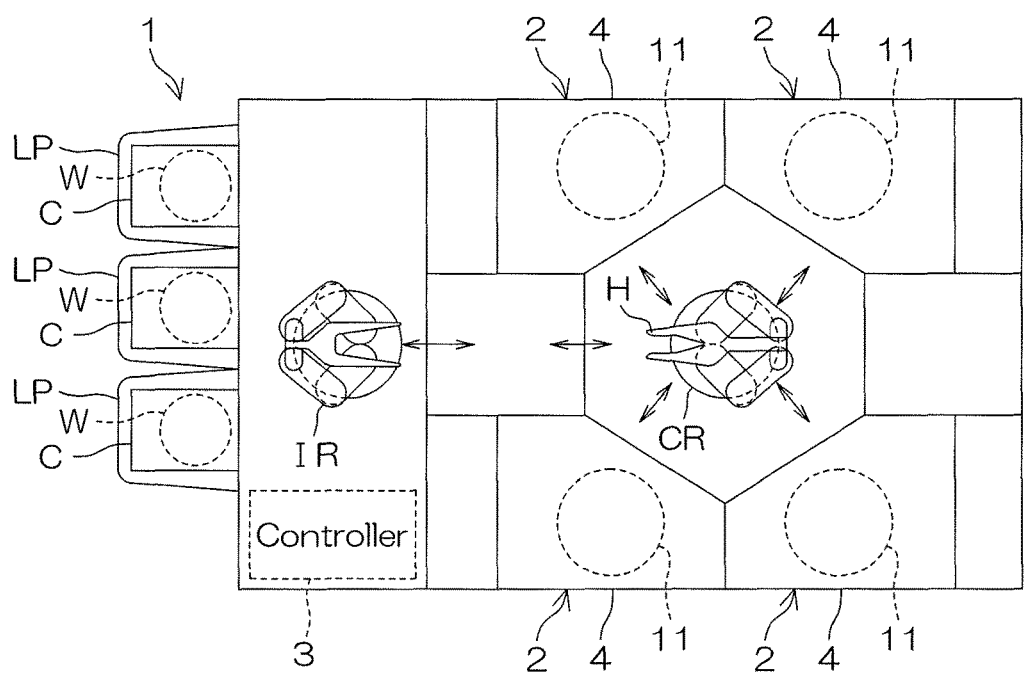
FIG. 1 is an illustrative plan view for describing an internal layout of a substrate processing apparatus according to one preferred embodiment of the present invention.

FIG. 1 is an illustrative plan view for describing an internal layout of a substrate processing apparatus 1 according to one preferred embodiment of the present invention. The substrate processing apparatus 1 is a single substrate processing type apparatus that processes a substrate W such as a silicon wafer one by one. In this preferred embodiment, the substrate W is a circular-disk shaped substrate. The substrate processing apparatus 1 includes a plurality of processing units 2 which process the substrate W with a processing liquid, a load port LP on which a substrate housing vessel (for example, FOUP (Front Opening Unified Pod)) C which houses a plurality of substrates W that constitute one lot is placed, a transfer robot IR and a transfer robot CR which transfer a substrate W between the load port LP and the processing unit 2, and a controller 3 which controls the substrate processing apparatus 1. The transfer robot IR transfers a substrate W between the substrate housing vessel C and the transfer robot CR. The transfer robot CR transfers a substrate W between the transfer robot IR and the processing unit 2. The plurality of processing units 2 are each provided with a similar configuration, for example.

Figure 2:
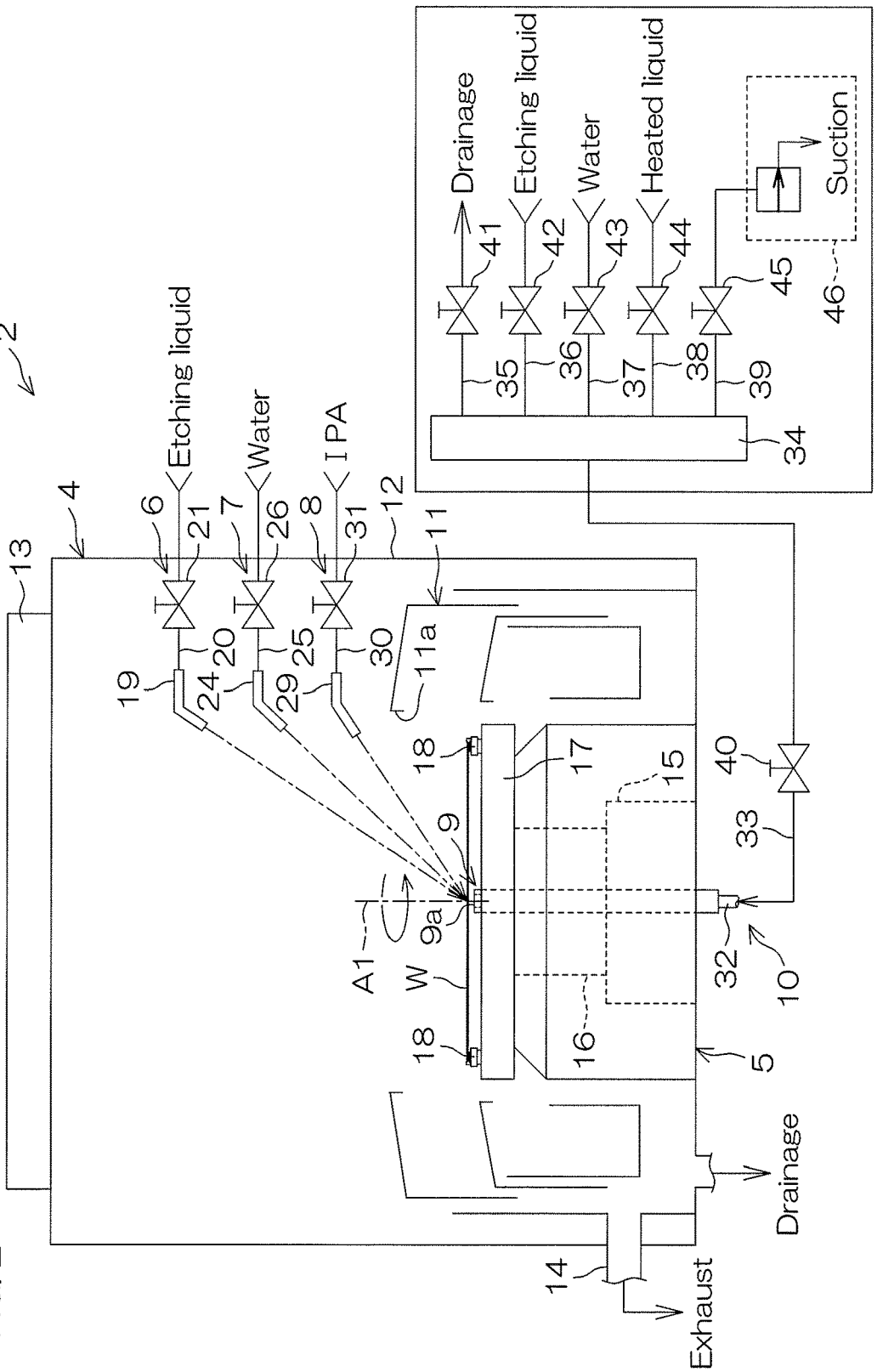
FIG. 2 is an illustrative sectional view for describing a configuration example of a processing unit included in the substrate processing apparatus.

FIG. 2 is an illustrative sectional view for describing a configuration example of the processing unit 2.

The processing unit 2 includes a box-shaped chamber 4, a spin chuck (substrate holding unit) 5 which holds one sheet of a substrate W inside the chamber 4 in a horizontal posture to rotate the substrate W around a perpendicular rotational axis A1 passing through the center of the substrate W, an etching liquid unit 6 which supplies an etching liquid to an upper surface of the substrate W held by the spin chuck 5, a water supplying unit 7 which supplies water to the upper surface of the substrate W held by the spin chuck 5, an organic solvent supplying unit 8 which supplies liquid IPA (isopropyl alcohol), one example of an organic solvent, to the upper surface of the substrate W held by the spin chuck 5, a lower surface nozzle 9 which discharges a liquid (processing liquid, heated liquid or coolant) toward a lower surface central portion of the substrate W (rear surface of the substrate W) held by the spin chuck 5, a lower surface supplying unit 10 which supplies a processing liquid to the lower surface nozzle 9, and a cylindrical cup 11 which surrounds the spin chuck 5.

The chamber 4 includes a box-shaped partition wall 12 which houses the spin chuck 5 and the nozzle, an FFU (fan filter unit) 13 which serves as an air feeding unit for feeding cleaned air (air filtered through a filter) from an upper portion of the partition wall 12 to an interior of the partition wall 12, and an exhaust duct 14 which expels a gas inside the chamber 4 from a lower portion of the partition wall 12. The FFU 13 is disposed above the partition wall 12 and mounted on a ceiling of the partition wall 12. The FFU 13 feeds cleaned air downward from the ceiling of the partition wall 12 to the interior of the chamber 4. The exhaust duct 14 is connected to a bottom of the cup 11 and introduces a gas inside the chamber 4 toward exhaust treatment equipment provided in a plant in which the substrate processing apparatus 1 is installed. Therefore, a downflow which flows downward inside the chamber 4 is formed by the FFU 13 and the exhaust duct 14. The substrate W is processed in a state that a downflow is formed inside the chamber 4.

As the spin chuck 5, there is adopted a clamping type chuck which clamps a substrate W in a horizontal direction to hold the substrate W horizontally. Specifically, the spin chuck 5 includes a spin motor 15, a spin shaft 16 formed integrally with a driving shaft of the spin motor 15, and a circular-plate shaped spin base 17 which is substantially horizontally mounted on an upper end of the spin shaft 16.

A plurality of clamping members 18 (three or more, for example, six) are disposed at a peripheral portion of the upper surface of the spin base 17. The plurality of clamping members 18 are disposed, with appropriate intervals kept, at the peripheral portion of the upper surface of the spin base 17 on a circumference corresponding to an outer circumferential shape of the substrate W.

Further, the spin chuck 5 is not limited to a clamping type chuck but may include a vacuum-suction type (vacuum chuck) in which, for example, a rear surface of a substrate W is sucked under vacuum to hold the substrate W in a horizontal posture and the substrate W held by the spin chuck 5 is rotated by being rotated around a perpendicular rotational axis, with the posture kept.

The etching liquid unit 6 includes an etching liquid nozzle 19. The etching liquid nozzle 19 is a straight nozzle which discharges a liquid, for example, in a state of continuous flow and is fixedly disposed above the spin chuck 5, with a discharge port thereof pointed to the vicinity of the rotation center of the upper surface of the substrate W. First etching liquid piping 20 which supplies an etching liquid at a normal temperature (first liquid temperature, for example, about 24° C.) from an etching liquid supply source is connected to the etching liquid nozzle 19. A first etching liquid valve 21 for switching between supply/supply stoppage of an etching liquid from the etching liquid nozzle 19 is placed on the first etching liquid piping 20. The etching liquid supplied to the etching liquid nozzle 19 includes diluted hydrofluoric acid (DHF) and buffered hydrofluoric acid (BHF) as an etching liquid supplied to the first etching liquid piping 20. As other etching liquids, there may also be used concentrated hydrofluoric acid (conc. HF), fluonitric acid (a mixture of hydrofluoric acid and nitric acid ($HNO_3$), ammonium fluoride and others. The etching liquid unit 6 may be provided with an etching liquid nozzle moving device which allows the etching liquid nozzle 19 to move, thereby scanning a position at which the etching liquid is placed with respect to the upper surface of the substrate W within the plane of the substrate W.)

The water supplying unit 7 includes a water nozzle 24. The water nozzle 24 is a straight nozzle which discharges a liquid, for example, in a state of continuous flow and is fixedly disposed above the spin chuck 5, with a discharge port thereof pointed to the vicinity of the rotation center of the upper surface of the substrate W. Water piping 25 which supplies water at a normal temperature (for example, about 24° C.) from a water supply source is connected to the water nozzle 24. A first water valve 26 for switching between supply/supply stoppage of water from the water nozzle 24 is placed on the water piping 25. Water supplied from the water nozzle 24 not only includes DIW (deionized water) but also includes carbonated water, electrolytic ion water, hydrogen water, ozone water, hydrochloric acid water with a diluted concentration (for example, about 10 to 100 ppm), reduction water (hydrogen water) and deaerated water. The water supplying unit 7 may be provided with a water nozzle moving device which allows the water nozzle 24 to move, thereby scanning a position at which water is placed with respect to the upper surface of the substrate W within the plane of the substrate W.

The organic solvent supplying unit 8 includes an organic solvent nozzle 29. The organic solvent nozzle 29 is a straight nozzle which discharges a liquid, for example, in a state of continuous flow and is fixedly disposed above the spin chuck 5, with a discharge port thereof pointed to the vicinity of the rotation center of the upper surface of the substrate W. Organic solvent piping 30 to which a liquid organic solvent (IPA) is supplied from an organic solvent supply source (IPA supply source) is connected to the organic solvent nozzle 29. An organic solvent valve 31 for switching between supply/supply stoppage of IPA from the organic solvent nozzle 29 is placed on the organic solvent piping 30. The organic solvent supplying unit 8 maybe provided with an organic solvent nozzle moving device which allows the organic solvent nozzle 29 to move, thereby scanning a position at which an organic solvent is placed with respect to the upper surface of the substrate W within the plane of the substrate W.

As shown in FIG. 2, the lower surface nozzle 9 has a discharge port 9a which faces the lower surface central portion of the substrate W held by the spin chuck 5. The discharge port 9a discharges a liquid upward perpendicularly. The discharged liquid is made incident substantially perpendicularly with respect to the lower surface central portion of the substrate W held by the spin chuck 5.

The lower surface supplying unit 10 includes first common piping 32 which extends vertically within the spin shaft 16, second common piping 33, one end of which is connected to the first common piping 32, and third common piping 34 which is connected to the other end of the second common piping 33.

The spin shaft 16 is a hollow shaft, and the first common piping 32 is inserted through the interior of the spin shaft 16 so as to extend vertically. The first common piping 32 extends up to a position which is close to the lower surface central portion of the substrate W held by the spin chuck 5, and the lower surface nozzle 9 is provided at the leading end of the first common piping. The first common piping 32 is formed by using PFA (perfluoroalkoxy ethylene), for example. The second common piping 33 connects the base end of the first common piping 32 (lower end of FIG. 2) with the third common piping 34. A common valve 40 for opening/closing the second common piping 33 is placed on the second common piping 33. The third common piping 34 has a pipe wall of a cabinet (for example, cylindrical tube) made of a resin (for example, PTFE (polytetrafluoroethylene)).

The lower surface supplying unit 10 includes drainage piping 35, one end (the left side of FIG. 2) of which is connected to the third common piping 34, second etching liquid piping (etching liquid supplying unit) 36, one end (the left side of FIG. 2) of which is connected to the third common piping 34, second water piping (piping cooling unit) 37, one end (the left side of FIG. 2) of which is connected to the third common piping 34, heated-liquid piping (heated-liquid supplying unit, high-temperature liquid supplying unit) 38, one end (the left side of FIG. 2) of which is connected to the third common piping 34, and suction piping 39, one end (the left side of FIG. 2) of which is connected to the third common piping 34.

A drainage valve 41 for opening and closing the drainage piping 35 is placed on the drainage piping 35. The other end of the drainage piping 35 is connected to drainage equipment outside the apparatus. The third common piping 34 is housed in a processing liquid box outside the processing unit 2. The processing liquid box is provided on each of the processing units 2 so as to correspond thereto on a one-to-one basis.

A second etching liquid valve (etching liquid supplying unit) 42 for opening and closing the second etching liquid piping 36 is placed on the second etching liquid piping 36. An etching liquid at a normal temperature (first liquid temperature, for example, about 24° C.) is supplied from an etching liquid supply source to the other end side of the second etching liquid piping 36. The etching liquid supplied to the second etching liquid piping 36 is an etching liquid similar to the etching liquid supplied to the first etching liquid piping 20.

A second water valve (piping cooling unit) 43 for opening and closing the second water piping 37 is placed on the second water piping 37. Water at a normal temperature (for example, about 24° C.) is to be supplied from a water supply source to the other end side of the second water piping 37. The water supplied to the second water piping 37 includes DIW (deionized water) and may also include carbonated water, electrolytic ion water, hydrogen water, ozone water, hydrochloric acid water with a diluted concentration (for example, about 10 to 100 ppm), reduction water (hydrogen water) and deaerated water.

A heated-liquid valve (piping heating unit, high-temperature liquid supplying unit) 44 for opening and closing the heated-liquid piping 38 is placed on the heated-liquid piping 38. A heated liquid is to be supplied from a heated-liquid supplying source to the other end side of the heated-liquid piping 38. The heated liquid is a liquid which is heated up to a high temperature (for example, a temperature (about 70 to 80° C.) close to a boiling point of IPA (about 82.4° C.)). A type of the heated liquid includes DIW (deionized water) and may also include carbonated water, electrolytic ion water, hydrogen water, ozone water, IPA or hydrochloric acid water with a diluted concentration (for example, about 10 to 100 ppm), reduction water (hydrogen water) and deaerated water.

A suction valve 45 for opening and closing the suction piping 39 is placed on the suction piping 39. A suction device 46 is connected to the other end side (leading end) of the suction piping 39. The suction device 46 is an ejector-type suction device, for example. As the suction device 46, there may be adopted a siphon type or a diaphragm type in place of the ejector type.

When the second etching liquid valve 42 and the common valve 40 are opened in a state that other valves of the lower surface supplying unit 10 are closed, an etching liquid is supplied from the second etching liquid piping 36 to the second common piping 33 and the etching liquid is discharged upward from the discharge port 9a.

Further, when the second water valve 43 and the common valve 40 are opened in a state that other valves of the lower surface supplying unit 10 are closed, water at a normal temperature is supplied from the second water piping 37 to the second common piping 33 and the water at a normal temperature is discharged upward from the discharge port 9a.

Further, when the heated-liquid valve 44 and the common valve 40 are opened in a state that other valves of the lower surface supplying unit 10 are closed, a heated liquid is supplied from the heated-liquid piping 38 to the second common piping 33, and the heated liquid is discharged upward from the discharge port 9a.

Further, when the second water valve 43 and the drainage valve 41 are opened in a state that other valves of the lower surface supplying unit 10 are closed, water at a normal temperature is circulated from the second water piping 37 through the interior of the third common piping 34 and supplied to the drainage piping 35. Thereby, it is possible to cool the pipe wall of the third common piping 34.

The suction device 46 is, for example, always in an operating condition. When the suction valve 45 is opened in the operating condition of the suction device 46, the suction device 46 is activated, and the interior of the suction piping 39 is exhausted. Thereby, the interior of the suction piping 39 is reduced in pressure, and a processing liquid (etching liquid, water or heated liquid) existing inside the first and the second common piping 32, 33 which are communicatively connected to the interior of the suction piping 39 is drawn into the suction piping 39.

The cup 11 is disposed outside from the substrate W held by the spin chuck 5 (in a direction spaced away from the rotational axis A1). The cup 11 surrounds the spin base 17. When a processing liquid is supplied to a substrate W in a state that the spin chuck 5 rotates the substrate W, the processing liquid supplied to the substrate W is separated and scattered around the substrate W. When the processing liquid is supplied to the substrate W, an upper end portion 11a of the cup 11 opened upward is disposed further above from the spin base 17. Therefore, the processing liquid (etching liquid, water or heated liquid) expelled around the substrate W is received by the cup 11. Then, the processing liquid received by the cup 11 is fed to a recovery device or a drainage device which is not illustrated.

Figure 3:
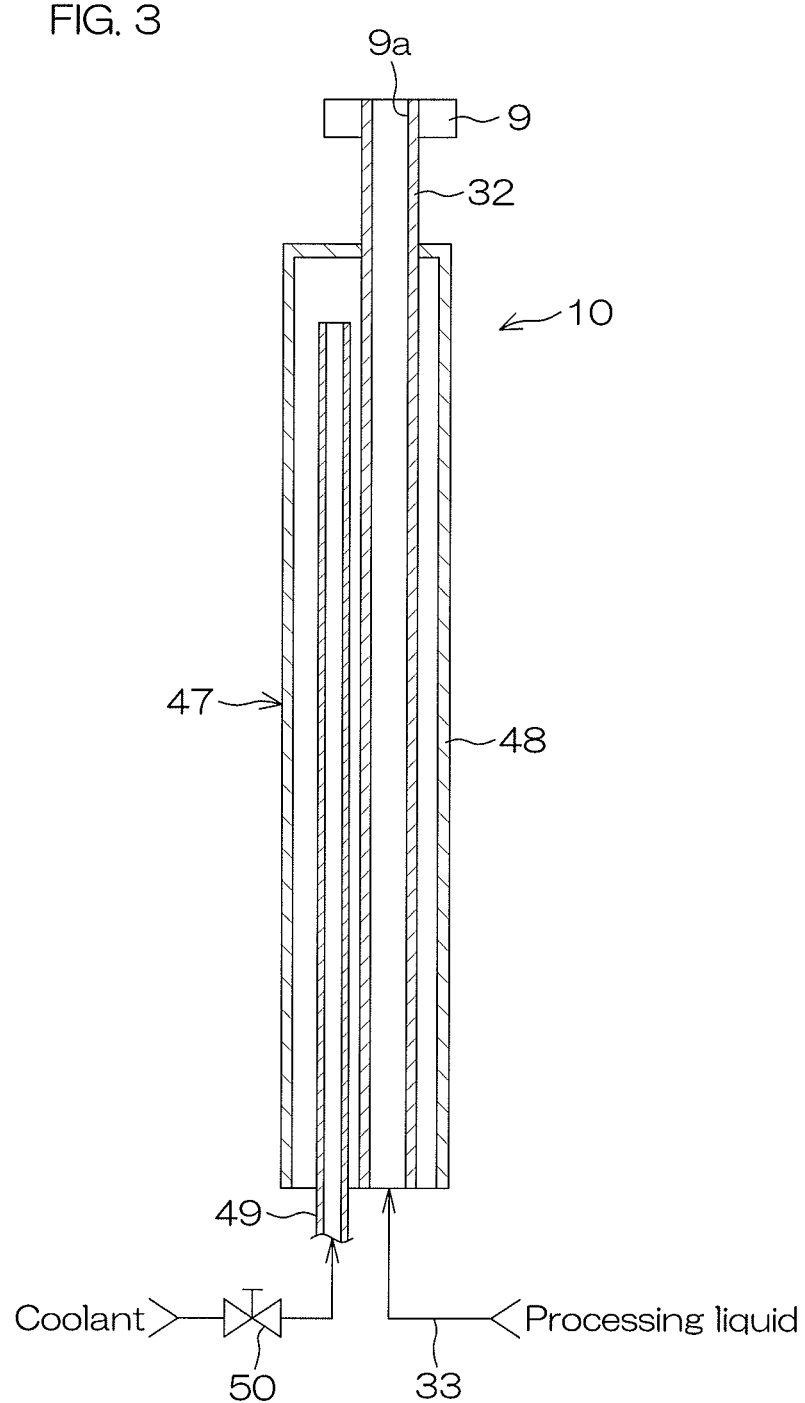
FIG. 3 is schematic longitudinal sectional view for describing an external cooling unit included in the processing unit.

The processing unit 2 further includes an external cooling unit 47 which cools the first common piping 32 from the exterior (refer to FIG. 3).

FIG. 3 is a schematic longitudinal sectional view for describing the external cooling unit 47.

The external cooling unit 47 includes an annular member 48 which surrounds an intermediate portion of the first common piping 32 and coolant piping 49, the leading end portion (the upper end portion of FIG. 3) of which is surrounded by the annular member 48. That is, the leading end portion of the first common piping 32 and that of the coolant piping 49 are inserted through the annular member 48. An upper end portion of the annular member 48 is closed, and the first common piping 32 is connected to the lower surface nozzle 9 after penetrating through the upper end portion of the annular member 48. The leading end (upper end of FIG. 3) of the coolant piping 49 is opened.

A coolant valve 50 for opening and closing the coolant piping 49 is placed on the coolant piping 49. A coolant is to be supplied from a coolant supply source to the other end side of the coolant piping 49. The coolant is a liquid having a normal temperature or having a liquid temperature lower than a normal temperature. A type of coolant includes DIW (deionized water) and may also include carbonated water, electrolytic ion water, hydrogen water, ozone water, IPA or hydrochloric acid water with a diluted concentration (for example, about 10 to 100 ppm), reduction water (hydrogen water), and deaerated water.

When the coolant valve 50 is opened, a coolant is discharged from the leading end of the coolant piping 49 and, therefore, the coolant is filled inside the annular member 48. Thereby, the coolant is brought into contact with an entire circumference of an outer wall of the first common piping 32 and, as a result, the pipe wall of the first common piping 32 is cooled from the exterior.

Figure 4:
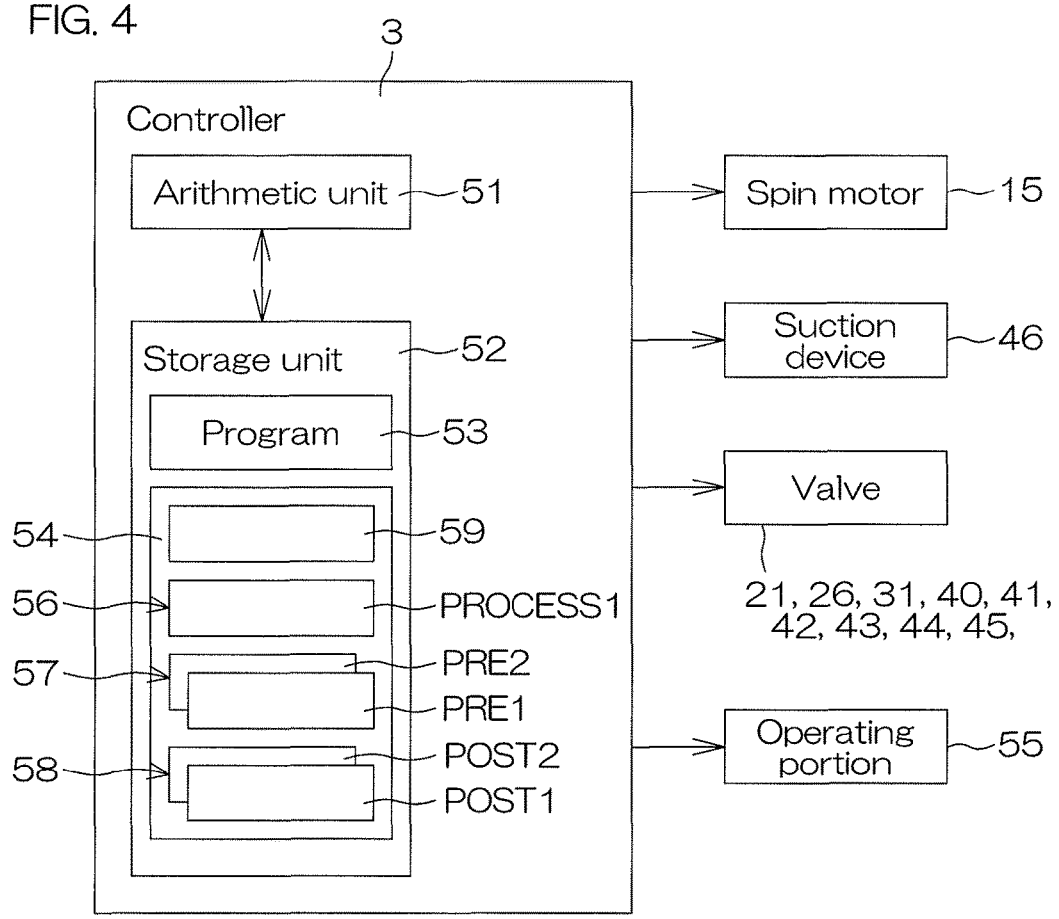
FIG. 4 is a block diagram for describing an electrical configuration of a major portion in the substrate processing apparatus.
Figure 5:
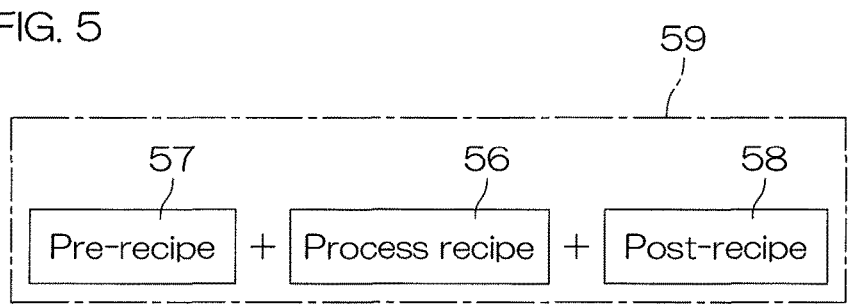
FIG. 5 is a drawing for describing configurations of a process recipe, a pre-recipe, a post-recipe and a flow recipe which are prepared in a controller.

FIG. 4 is a block diagram for describing an electrical configuration of a major portion of the substrate processing apparatus 1. FIG. 5 is a drawing for describing configurations of a process recipe 56, a pre-recipe 57, a post-recipe 58 and a flow recipe 59 which are prepared in the controller 3.

The controller 3 is constituted by using a microcomputer, for example. The controller 3 is provided with an arithmetic unit 51 such as a CPU, a fixed memory device (not illustrated), a storage unit 52 such as a hard disk drive and an input/output unit (not illustrated). A program 53 executed by the arithmetic unit 51 is stored at the storage unit 52.

The storage unit 52 includes a recipe storage portion 54 for storing a recipe which specifies each of processing contents for the substrate W. The recipe storage portion 54 is composed of a non-volatile memory capable of electrically rewriting data. At the recipe storage portion 54, there are stored the process recipe 56, the pre-recipe 57, the post-recipe 58 and the flow recipe 59 prepared by operations of an operating portion 55. The process recipe 56 determines processing contents (including procedures and conditions and the same will be applied hereinafter) for the substrate W. The pre-recipe 57 is one example of a preliminary operation recipe, determining pre-processing contents determined in advance. The post-recipe 58 is one example of a preliminary operation recipe, determining post-processing contents determined in advance. As shown in FIG. 5, the flow recipe 59 determines an order of execution and the number of times of execution with regard to control according to the process recipe (process recipe control), control according to the pre-recipe (pre-recipe control) and control according to the post-recipe (post-recipe control). For example, as the process recipe 56 stored at the recipe storage portion 54, one recipe of the process recipe PROCESS 1 (first recipe) is given as an example, as the pre-recipe 57 stored at the recipe storage portion 54, two recipes of the pre-recipe PRE 1 (second recipe) and the pre-recipe PRE 2 are given as examples, and as the post-recipe 58 stored at the recipe storage portion 54, two recipes of the post-recipe POST 1 (third recipe) and the post-recipe POST 2 are given as examples. However, it is obvious that they are only examples, to which the present invention shall not be limited.

In the substrate processing apparatus 1, substrates W with a predetermined number of sheets (for example, 25 sheets) which constitute one lot are carried into the substrate housing vessel C (refer to FIG. 1) in a state that they are housed therein collectively. In the substrate processing apparatus 1, one flow recipe 59 shown in FIG. 5 is set for each substrate housing vessel C. As shown in FIG. 5, the flow recipe 59 includes the process recipe 56 which determines processing contents, the pre-recipe 57 which determines pre-processing contents executed before a series of processing and the post-recipe 58 which determines post-processing contents executed after a series of processing.

When the substrate housing vessel C (refer to FIG. 1) is placed on the load port LP (refer to FIG. 1) of the substrate processing apparatus 1, substrate information which shows information on a lot contained in the substrate housing vessel C is transmitted from a host computer to the controller 3. The host computer is a computer which manages a plurality of substrate processing apparatuses installed in a semiconductor manufacturing plant. In the controller 3, the flow recipe 59 for the lot in question is read out from the recipe storage portion 54 on the basis of the substrate information transmitted from the host computer. Then, according to the flow recipe 59, the pre-recipe control, the process recipe control and the post-recipe control are executed sequentially. First, at each of the processing units 2 (refer to FIG. 1), the control according to the pre-recipe 57 is executed, by which pre-processing is executed. Thereafter, the control according to the process recipe 56 is repeatedly executed, by which substrates W housed in one substrate housing vessel C are continuously carried into the processing unit 2 one after another and subjected to substrate processing in the processing unit 2. Then, the control according to the process recipe 56 is executed only by a predetermined number of times equal to the number of sheets of the substrates housed in the substrate housing vessel C. Upon completion of a series of processing executed by a predetermined number of times, at each of the processing units 2, the control according to the post-recipe 58 is executed, by which post processing is executed.

Further, the controller 3 controls operation of the spin motor 15 and the suction device 46. The controller 3 also opens and closes the first etching liquid valve 21, the first water valve 26, the organic solvent valve 31, the common valve 40, the drainage valve 41, the second etching liquid valve 42, the second water valve 43, the heated-liquid valve 44, the suction valve 45, the coolant valve 50 and others.

Figure 6:
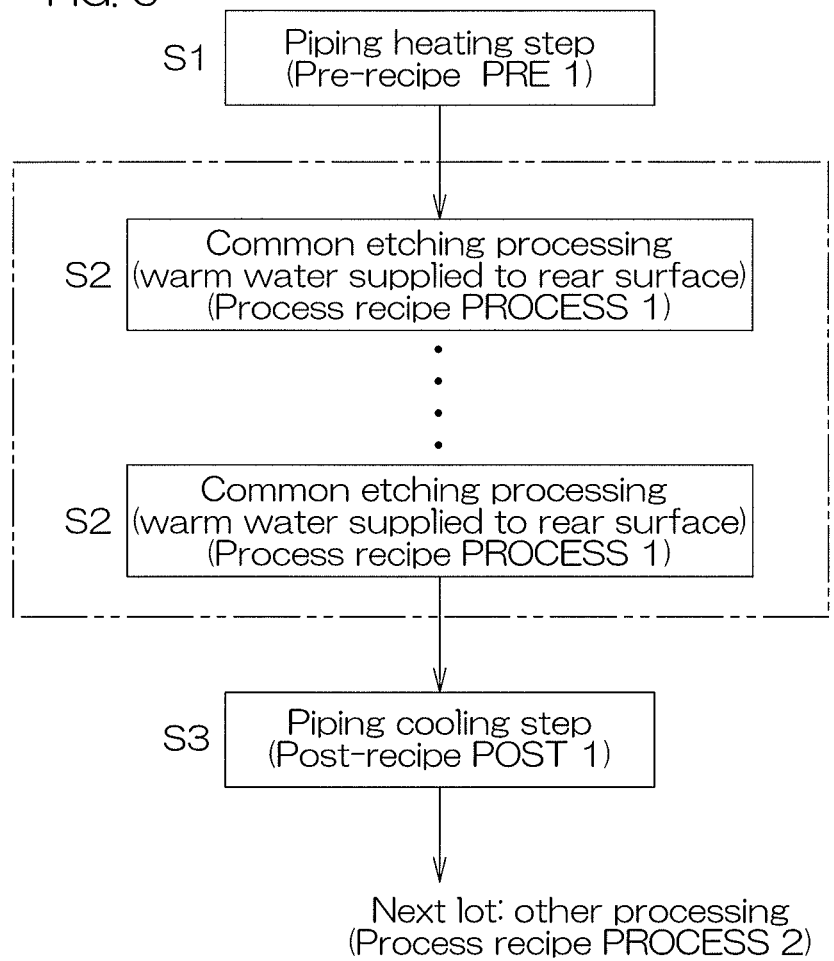
FIG. 6 is a flowchart for describing processing contents executed by the processing unit.

FIG. 6 is a flowchart for describing processing contents executed at each of the processing units 2.

Processing is applied to one lot (the plurality of substrates W) in one or the plurality of processing units 2. In this preferred embodiment, in processing one lot of substrates W (a plurality of substrates W), the number N (N is an integer of 2 or more) of sheets of substrates W are processed in the processing unit 2. Where the process recipe 56 (refer to FIG. 4) is the process recipe PROCESS 1, the common etching processing (S2) which applies etching (Step S2) under mutually common conditions is applied to a plurality of substrates. Where the pre-recipe 57 (refer to FIG. 4) is the pre-recipe PRE 1, as pre-processing, there is executed the piping heating step (Step S1) in which the common piping 32 to 34 are heated to raise a temperature of the pipe wall of each of the common piping 32 to 34. Where the post-recipe 58 (refer to FIG. 4) is the post-recipe POST 1, as post processing, there is executed the piping cooling step (Step S3) in which the common piping 32 to 34 are cooled to lower a temperature of the pipe wall of each of the common piping 32 to 34.

Therefore, the piping heating step (S1) is executed in each of the processing units 2 (refer to FIG. 1). Thereafter, the substrates W housed in one substrate housing vessel C are continuously carried into the processing unit 2 one after another and subjected to common etching processing (S2) in the processing unit 2. Upon completion of the N number of times of the common etching processing (S2), the piping cooling step (S3) is executed in each of the processing unit 2.

Figure 7:
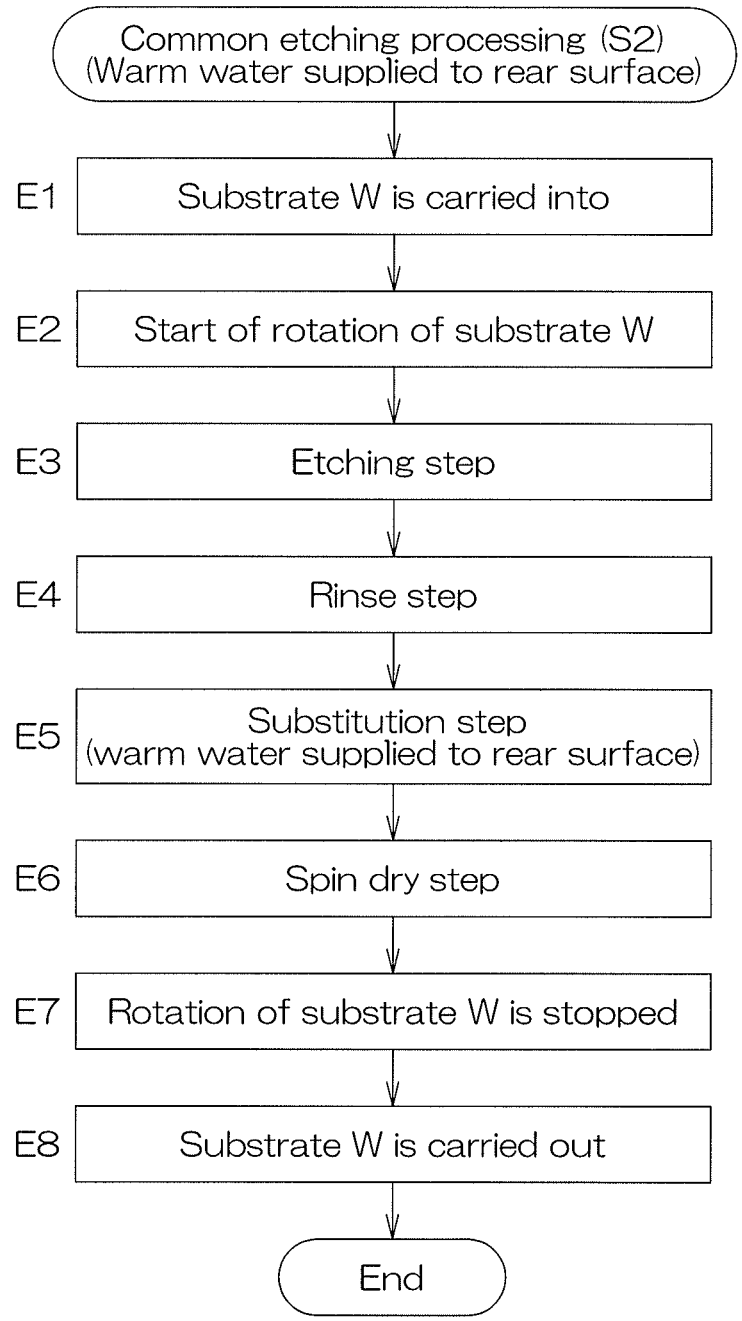
FIG. 7 is a flowchart for describing common etching executed on the basis of the process recipe.
Figure 8:
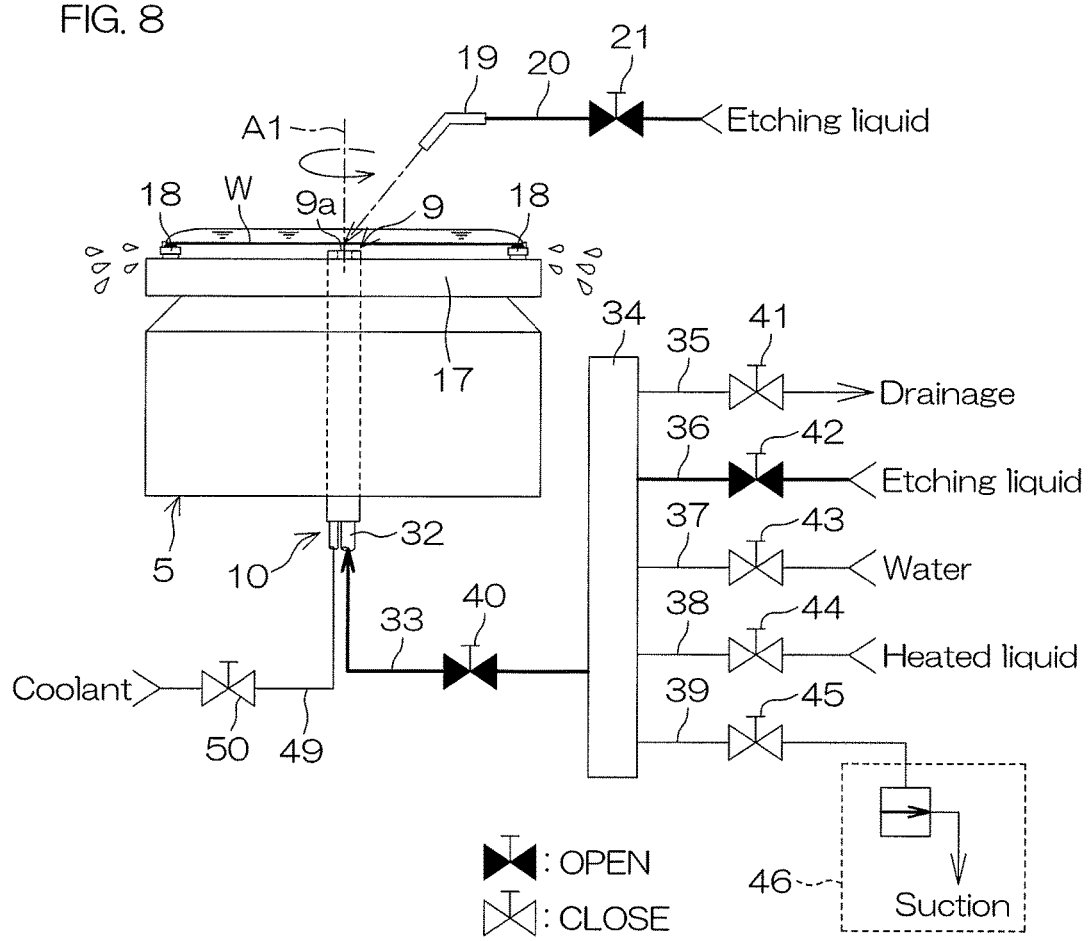
FIG. 8 is a drawing for describing an etching step shown in FIG. 7.
Figure 9:
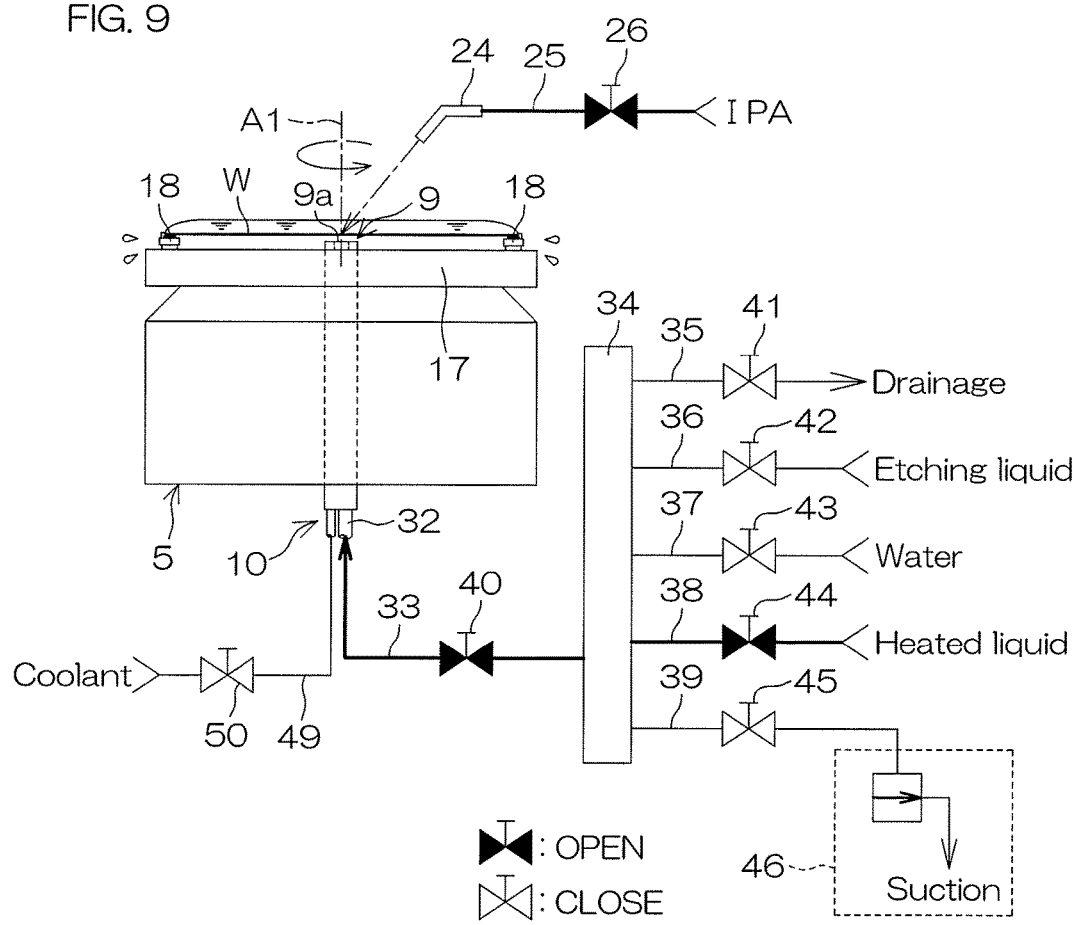
FIG. 9 is a drawing for describing an organic solvent step shown in FIG. 7.

FIG. 7 is a flowchart for describing the common etching processing (S2) executed on the basis of the process recipe PROCESS 1. FIG. 8 is a drawing for describing the etching step (E3). FIG. 9 is a drawing for describing the substitution step (E5). The etching will be described with reference to FIG. 1, FIG. 2, FIG. 4, FIG. 6 and FIG. 7. FIG. 8 will be referred to, whenever necessary.

When etching is executed by the processing unit 2, a substrate W which is not yet processed is carried into the interior of the chamber 4 (Step E1 in FIG. 7).

Specifically, a hand H of the transfer robot CR which holds a substrate W is allowed to advance into the interior of the chamber 4, by which the substrate W is delivered to the spin chuck 5 in a state that a surface thereof (surface to be etched) is pointed above. Thereafter, the substrate W is held by the spin chuck 5.

After the substrate W is held by the spin chuck 5, the controller 3 controls the spin motor 15 to start rotation of the substrate W (Step E2 in FIG. 7). A rotational speed of the substrate W is accelerated up to a liquid treatment speed (a predetermined speed from about 300 rpm to about 1000 rpm).

When the rotational speed of the substrate W reaches the liquid treatment speed, the controller 3 then starts to execute the etching step (Step E3 in FIG. 7). Specifically, the controller 3 opens the first etching liquid valve 21 and also opens the second etching liquid valve 42 and the common valve 40, while closing other valves of the lower surface supplying unit 10. Thereby, as shown in FIG. 8, an etching liquid is discharged from the etching liquid nozzle 19 toward the upper surface central portion of the substrate W and the etching liquid is also discharged from the discharge port 9a of the lower surface nozzle 9 toward the lower surface central portion of the substrate W. The etching liquid supplied to the upper surface central portion of the substrate W is subjected to a centrifugal force derived from rotation of the substrate W and flows on the upper surface of the substrate W toward a peripheral portion of the substrate W. Further, the etching liquid supplied to the lower surface central portion of the substrate W is subjected to a centrifugal force derived from rotation of the substrate W and flows along the lower surface of the substrate W toward a peripheral portion of the substrate W. Thereby, etching is applied to an entire region of the upper and lower surfaces of the substrate W.

After the elapse of a predetermined period of time from the start of discharging the etching liquid, the controller 3 closes the first etching liquid valve 21, the second etching liquid valve 42 and the common valve 40 to stop discharge of the etching liquid from the etching liquid nozzle 19 and from the lower surface nozzle 9.

Then, the controller 3 starts to execute a rinse step (Step E4 in FIG. 7). Specifically, the controller 3 opens the first water valve 26 and also opens the second water valve 43 and the common valve 40, while closing other valves of the lower surface supplying unit 10. Thereby, water is discharged from the water nozzle 24 toward the upper surface central portion of the substrate W and water is also discharged from the discharge port 9a of the lower surface nozzle 9 toward the lower surface central portion of the substrate W.

The water supplied to the upper surface central portion of the substrate W is subjected to a centrifugal force derived from rotation of the substrate W and flows on the upper surface of the substrate W toward a peripheral portion of the substrate W. Thereby, the etching liquid adhered on the upper surface of the substrate W is washed away. Further, the water supplied to the lower surface central portion of the substrate W is subjected to a centrifugal force derived from rotation of the substrate W and flows along the lower surface of the substrate W toward a peripheral portion of the substrate W. Thereby, the etching liquid adhered on the lower surface of the substrate W is washed away. Therefore, rinse liquid is applied to an entire region of the upper and lower surfaces of the substrate W.

After the elapse of a predetermined period of time from the start of discharging water, the controller 3 closes the first water valve 26, the second water valve 43 and the common valve 40 to stop the discharge of water from the water nozzle 24 and the lower surface nozzle 9.

Next, the controller 3 starts to execute a substitution step (Step E5 in FIG. 5, high-temperature liquid discharge step). The substitution step (E5) is a step in which water on the substrate W is substituted with an organic solvent lower in surface tension than water. Specifically, as shown in FIG. 9, the controller 3 opens the organic solvent valve 31 to supply an organic solvent from the organic solvent nozzle 29 toward the upper surface central portion of the substrate W. Further, the organic solvent supplied to the substrate W is subjected to a centrifugal force derived from rotation of the substrate W and flows to a peripheral portion of the substrate W. Thereby, water is substituted with the organic solvent in an entire region of the upper surface (pattern forming surface) of the substrate W. Still further, the substitution step (E5) may be executed in a state that a rotational speed of the substrate W is reduced to a paddle speed. The paddle speed is a rotational speed of the substrate W in a case where a centrifugal force acting on a liquid film of the organic solvent on the upper surface of the substrate W is smaller than surface tension acting between the organic solvent and the upper surface of the substrate W or the centrifugal force is substantially antagonistic to the surface tension.

In addition, in the substitution step (E5), in tandem with supply of the organic solvent to the upper surface of the substrate W, a heated liquid (high-temperature liquid, a liquid heated up to a temperature (about 70 to 80° C.) close to a boiling point of IPA (about 82.4° C.) is supplied to the lower surface of the substrate W. Specifically, as shown in FIG. 9, the controller 3 opens the heated-liquid valve 44 and the common valve 40, while closing other valves of the lower surface supplying unit 10. Thereby, the heated liquid is discharged upward from the discharge port 9a of the lower surface nozzle 9 and the heated liquid is supplied to the lower surface central portion of the substrate W. In tandem with discharge of the heated liquid from the discharge port 9a, the substrate W is rotated at the liquid treatment speed, thus making it possible to supply the heated liquid to an entire region of the lower surface of the substrate W. Thereby, the substrate W is warmed by supply of the heated liquid, by which an interface between the substrate W and the organic solvent can be raised in temperature to improve a substitution efficiency of the organic solvent.

Next, there is performed a spin dry process (Step E6 in FIG. 7) in which the substrate W is dried. Specifically, the controller 3 controls the spin motor 15, thereby accelerating rotation of the substrate W up to a drying rotational speed (for example, several thousand rotations per minute) greater than the rotational speed from the etching step (E3) to the rinse step (E5) and rotating the substrate W at the drying rotational speed. Thereby, a great centrifugal force is applied to a liquid on the substrate W and the liquid adhered on the substrate W is separated and scattered around the substrate W. In this way, the liquid is removed from the substrate W to dry the substrate W.

After the elapse of a predetermined period of time from the start of high-speed rotation of the substrate W, the controller 3 controls the spin motor 15 to stop rotation of the substrate W by the spin chuck 5 (Step E7 in FIG. 7).

Thereafter, the substrate W is carried out from the interior of the chamber 4 (Step E8 in FIG. 7). Specifically, the controller 3 allows the hand of the transfer robot CR to advance into the chamber 4. Then, the controller 3 allows the hand of the transfer robot CR to hold the substrate W on the spin chuck 5. Thereafter, the controller 3 allows the hand of the transfer robot CR to retract from the interior of the chamber 4. Thereby, the substrate W after etching is carried out from the chamber 4.

It is noted that in the common etching processing (S2), there is not performed a step in which the pipe wall of each of the common piping 32 to 34 is lowered in temperature after the substrate W has been carried out.

Figure 10:
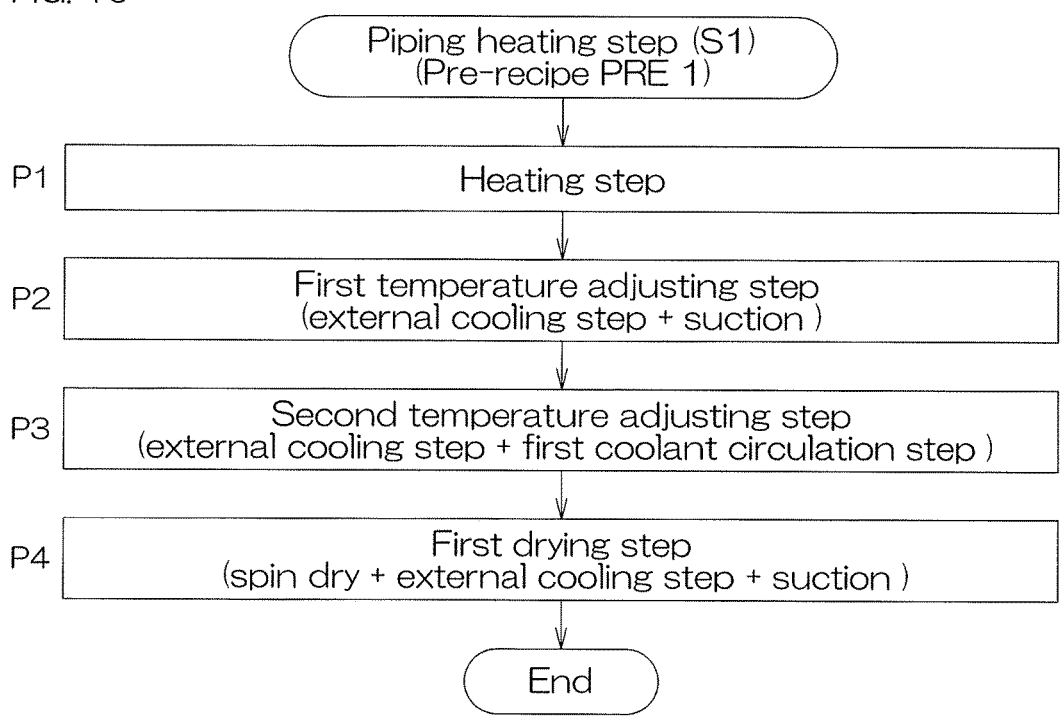
FIG. 10 is a flowchart for describing a piping heating step executed on the basis of the pre-recipe.
Figure 11:
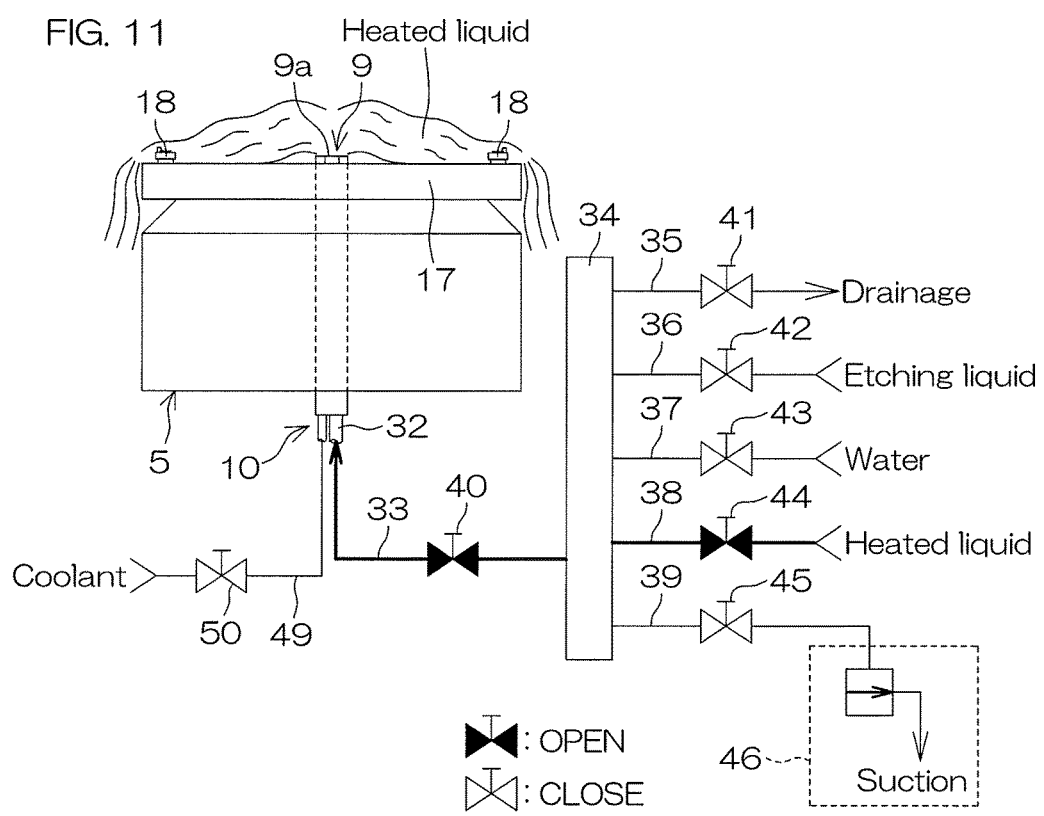
FIG. 11 is a drawing for describing a heating step shown in FIG. 10.
Figure 12:
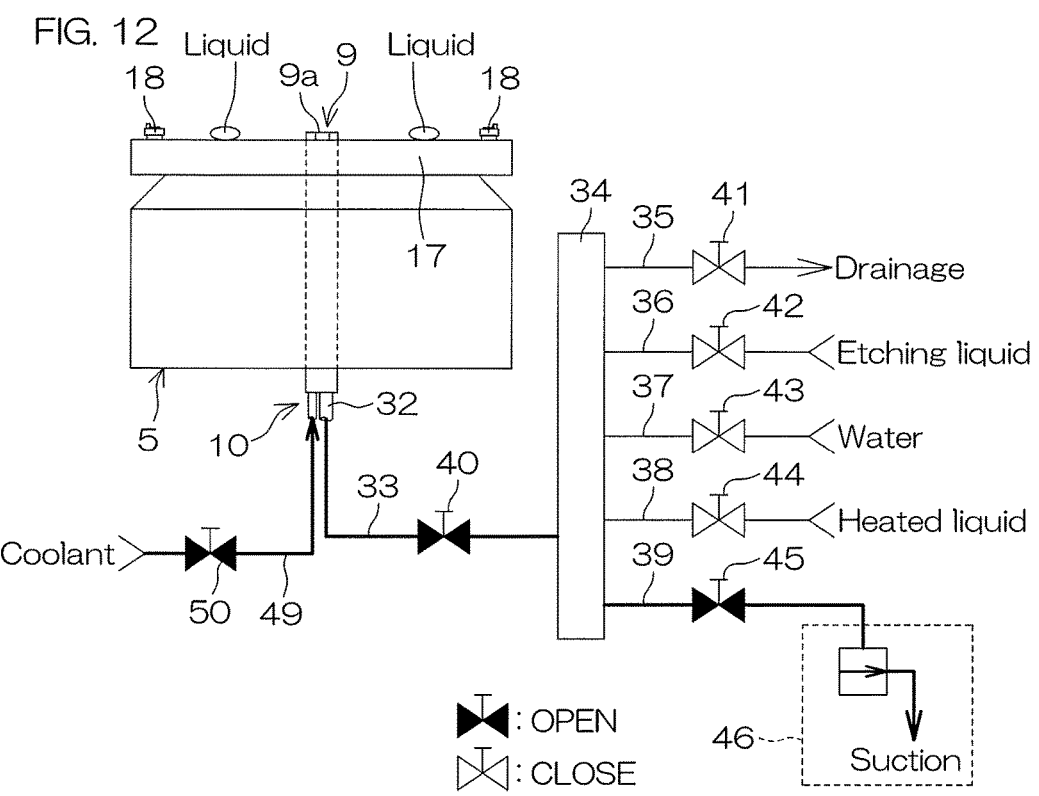
FIG. 12 is a drawing for describing a first temperature adjusting step shown in FIG. 10.
Figure 13:
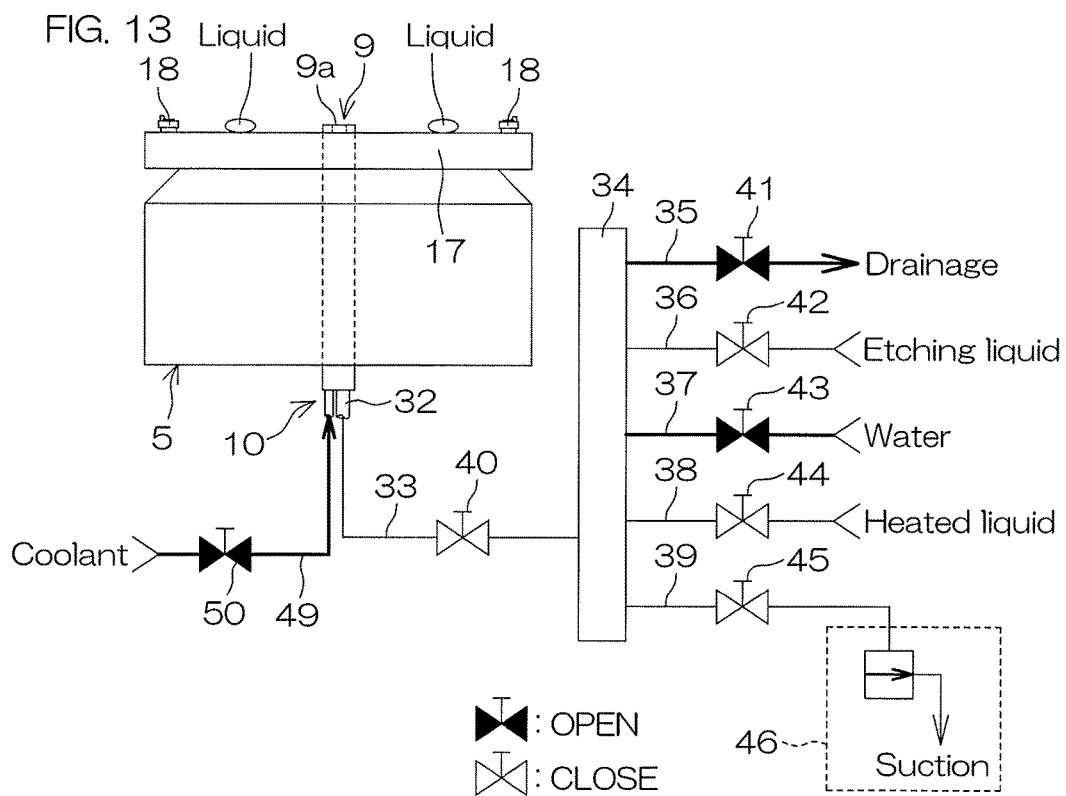
FIG. 13 is a drawing for describing a second temperature adjusting step shown in FIG. 10.
Figure 14:
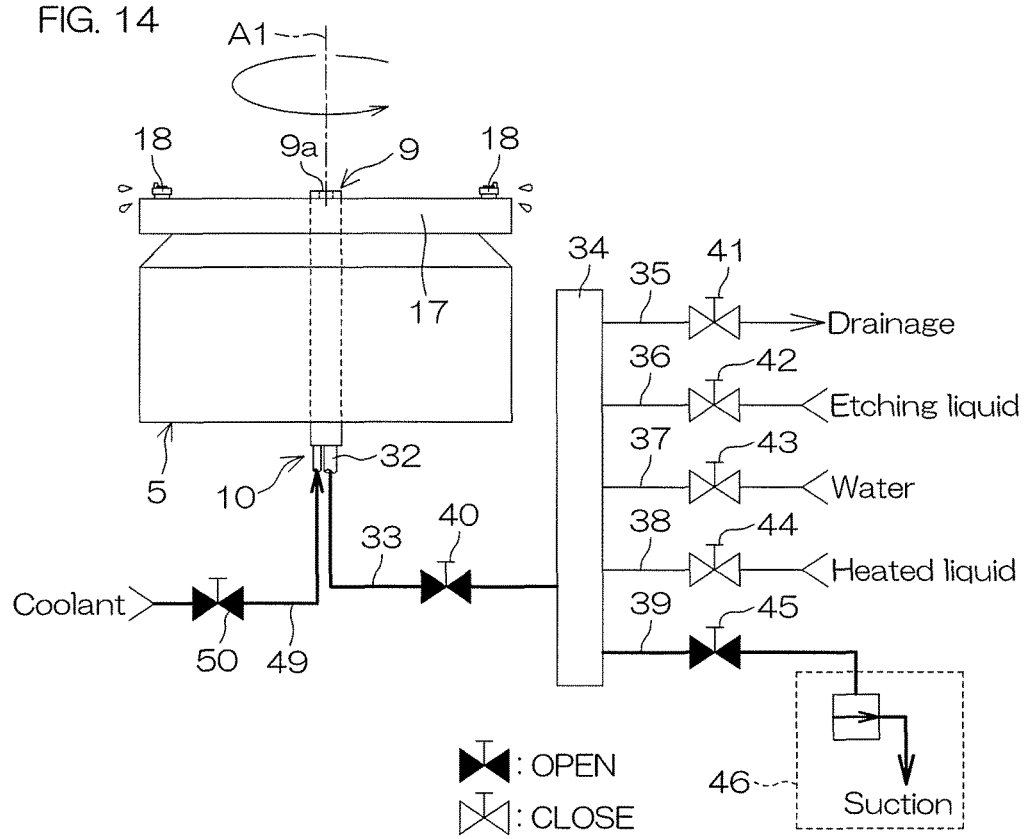
FIG. 14 is a drawing for describing a first drying step shown in FIG. 10.

FIG. 10 is a flowchart for describing a piping heating step (S1) executed on the basis of the pre-recipe PRE 1. FIG. 11 is a drawing for describing a heating step (P1). FIG. 12 is a drawing for describing a first temperature adjusting step (P2). FIG. 13 is a drawing for describing a second temperature adjusting step (P3). FIG. 14 is a drawing for describing a first drying step (P4). The piping heating step (S1) will be described with reference to FIG. 1, FIG. 2, FIG. 4 and FIG. 10. FIG. 11 to FIG. 14 will be referred to, whenever necessary.

Figure 19:
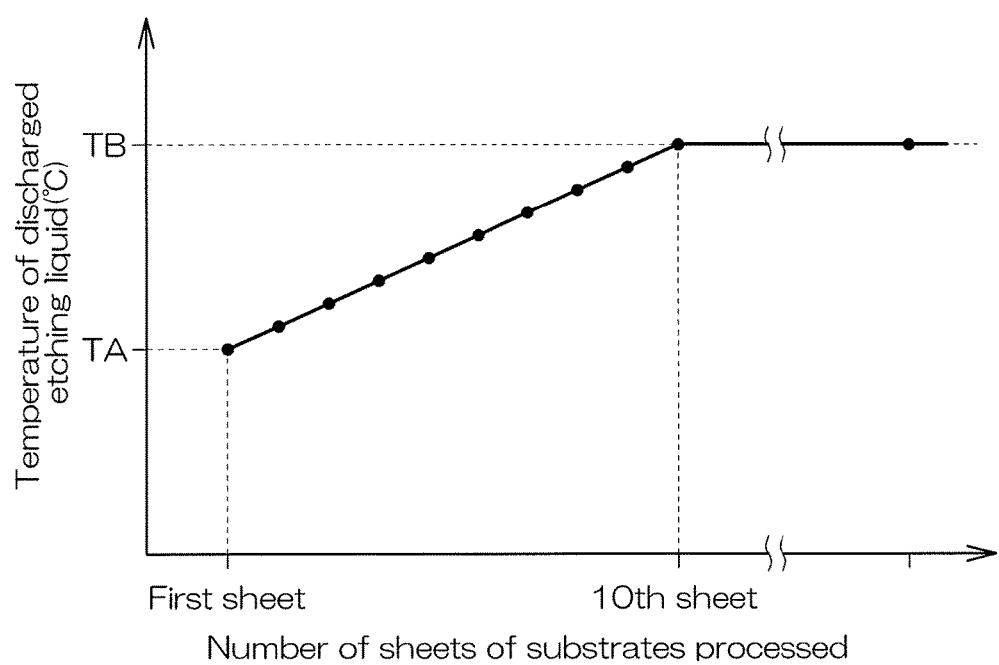
FIG. 19 is a graph for describing a relationship between the number of sheets of substrates subjected to etching processing and a temperature of an etching liquid discharged from a lower surface nozzle.

The piping heating step (S1) is a step in which before the initial common etching processing in the common etching processing (S2) applied to substrates W of a common lot, the pipe wall of each of the common piping 32 to 34 is raised in temperature up to a thermal equilibrium temperature (second liquid temperature) TB (for example, about 28° C., refer to FIG. 19). The thermal equilibrium temperature TB is a temperature of the pipe wall of each of the common piping 32 to 34 and a thermal equilibrium temperature which will converge (in thermodynamic equilibrium) upon continuous execution of the common etching processing (S2) in the processing unit 2. The thermal equilibrium temperature TB can be determined experimentally. Then, a flow rate of a heated liquid supplied and a period of time of supplying the heated liquid which will be described later in the piping heating step (S1) are set on the basis of the thermal equilibrium temperature TB.

In this preferred embodiment, the piping heating step (S1) is performed before a substrate W is carried into each of the chambers 4.

Specifically, as shown in FIG. 11, the controller 3 opens the heated-liquid valve 44 and the common valve 40 while closing other valves of the lower surface supplying unit 10. Thereby, a heated liquid having a liquid temperature of about 70 to 80° C. is fed to the third common piping 34, the second common piping 33 and the first common piping 32 to heat the common piping 32 to 34 (P1: heating step). This heated liquid is circulated through the third common piping 34, the second common piping 33 and the first common piping 32, fed to the lower surface nozzle 9 and discharged upward from the discharge port 9a.

Usually, the temperature of each of the first to the third common piping 32 to 34 is a normal temperature (for example, about 24° C.). The heated liquid is circulated to raise the temperature of the pipe wall of each of the first to the third common piping 32 to 34. Where a flow rate of supplying the heated liquid to the lower surface nozzle 9 is about 0.4 (liters/minute), the heated liquid is circulated over about 40 seconds (heated-liquid circulation step). Thereby, the pipe wall of each of the first to the third common piping 32 to 34 can be raised in temperature up to a predetermined raised temperature (about 73° C.) higher than the thermal equilibrium temperature TB.

After the elapse of a predetermined period of time from the start of supplying the heated liquid (about 40 seconds), the controller 3 closes the heated-liquid valve 44 and the common valve 40 to stop circulation of the heated liquid through the first to the third common piping 32 to 34.

Next, the controller 3 starts to execute a first temperature adjusting step (Step P2). Specifically, as shown in FIG. 12, the controller 3 opens a coolant valve 50. When the coolant valve 50 is opened, a coolant is supplied into the annular member 48, by which the coolant is brought into contact with an entire circumference of an outer wall of the first common piping 32 to cool the pipe wall of the first common piping 32 from the exterior (external cooling step).

Further, in the first temperature adjusting step (P2), in tandem with cooling of the first common piping 32, the heated liquid existing inside the first to the third common piping 32 to 34 is sucked. Specifically, as shown in FIG. 12, the controller 3 closes the common valve 40 and also opens the suction valve 45, thereby activating operation of the suction device 46. Thereby, the interior of the third common piping 34 and the interior of each of the first and the second common piping 32, 33 which is communicatively connected to the interior of the third common piping 34 are individually exhausted, and the heated liquid existing inside the first to the third common piping 32 to 34 is drawn into the suction piping 39 by a suction force derived from the suction device 46. The heated liquid is continuously sucked until a leading end surface of the heated liquid moves backward to a downstream side (the right side in FIG. 12) from the suction valve 45.

When the leading end surface of the heated liquid moves backward to a downstream side (the right side in FIG. 12) from the suction valve 45, the controller 3 closes the common valve 40 and the suction valve 45, thereby disabling operation of the suction device 46. Thereby, the first temperature adjusting step (P2) is completed. At this time, external cooling of the first common piping 32 (external cooling step) still continues.

Following completion of the first temperature adjusting step (P2), the controller 3 starts to execute a second temperature adjusting step (Step P3). Specifically, as shown in FIG. 13, the controller 3 opens the second water valve 43 and the drainage valve 41, while closing other valves of the lower surface supplying unit 10. Thereby, water at a normal temperature is circulated from the second water piping 37 through the interior of the third common piping 34 and supplied to the drainage piping 35. Thereby, it is possible to cool the pipe wall of the third common piping 34 (first coolant circulation step).

After the elapse of a predetermined period of time from the start of supplying water at a normal temperature to the third common piping 34, the controller 3 closes the second water valve 43 and the drainage valve 41 to stop the supply of the water at a normal temperature to the interior of the third common piping 34. Thereby, cooling of the third common piping 34 is completed (first coolant circulation step). At this time, external cooling of the first common piping 32 (external cooling step) is continued.

Following completion of the second temperature adjusting step (P3), the controller 3 starts to execute a first drying step (P4). Specifically, the controller 3 controls the spin motor 15 to start rotation of the spin base 17, thereby, as shown in FIG. 14, accelerating rotation of the spin base 17 up to a drying rotational speed (for example, several thousand rotations per minute) greater than the notational speed from the etching step (E3) to the rinse step (E4), rotating the spin base 17 at the drying rotational speed. Thereby, a great centrifugal force is applied to a heated liquid on the spin base 17, and the heated liquid adhered on the upper surface of the spin base 17 is separated and scattered around a substrate W. In this way, the heated liquid is removed from the spin base 17 to dry the spin base 17.

After the elapse of a predetermined period of time from the start of high-speed rotation of a substrate W, the controller 3 controls the spin motor 15 to stop rotation of the substrate W by the spin chuck 5. Further, the controller 3 closes the coolant valve 50 to stop supply of a coolant into the annular member 48. Thereby, external cooling of the first common piping 32 (external cooling step) is completed.

A series of the piping heating steps (S1) are completed. Thereafter, substrates W housed in the substrate housing vessel C (refer to FIG. 1) are continuously carried into the processing unit 2 one after another and subjected to the common etching processing (S2) in the processing unit 2. Before the initial common etching processing (S2), the pipe wall of each of the common piping 32 to 34 is raised in temperature up to the thermal equilibrium temperature TB. Therefore, the substrate W can be etched by using an etching liquid at the thermal equilibrium temperature TB from the etching step (E3) according to the initial common etching processing (S2).

Thereafter, the piping cooling step (S3) is executed on the basis of the post-recipe POST 1 (refer to FIG. 4).

Figure 15:
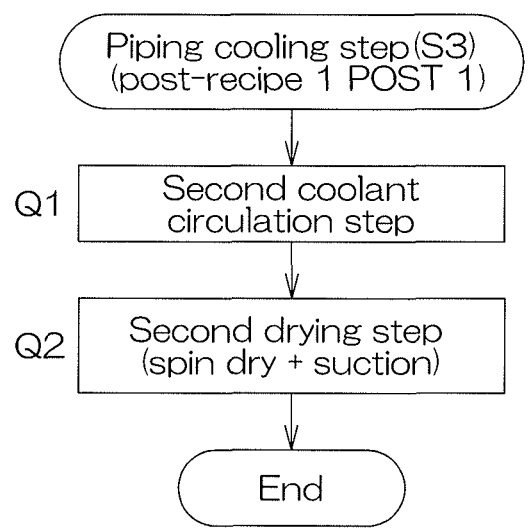
FIG. 15 is a flowchart for describing a piping cooling step executed on the basis of the post-recipe.
Figure 16:
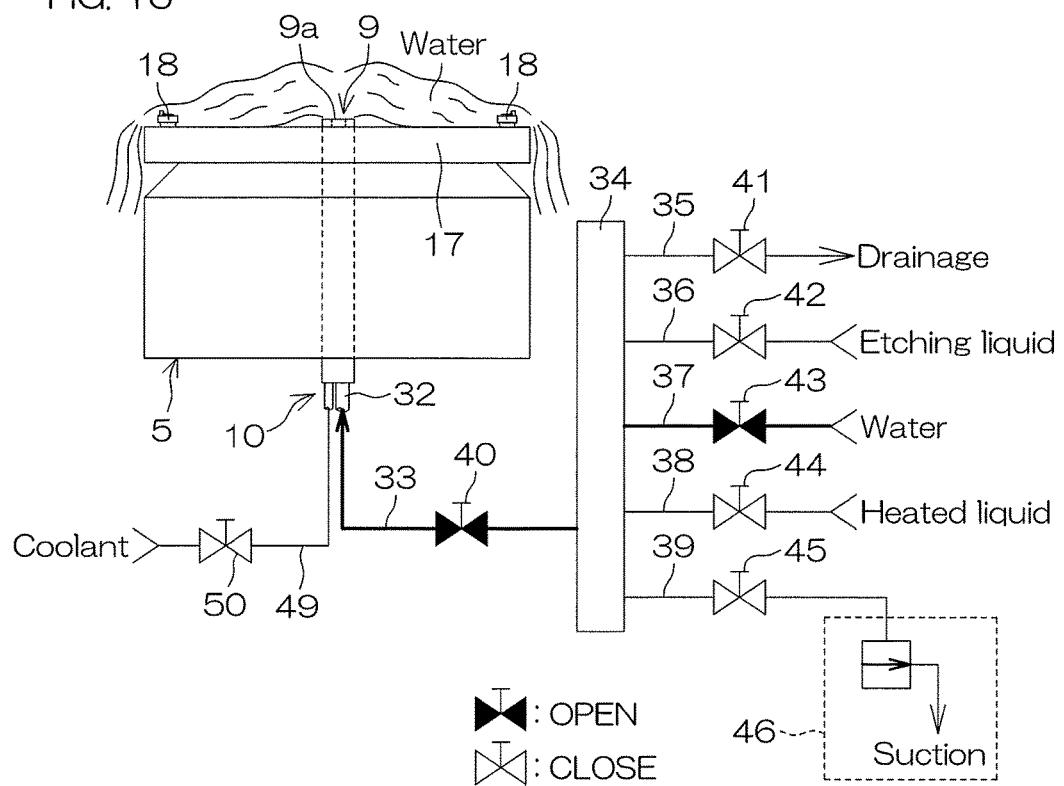
FIG. 16 is a drawing for describing a second coolant circulation step shown in FIG. 15.
Figure 17:
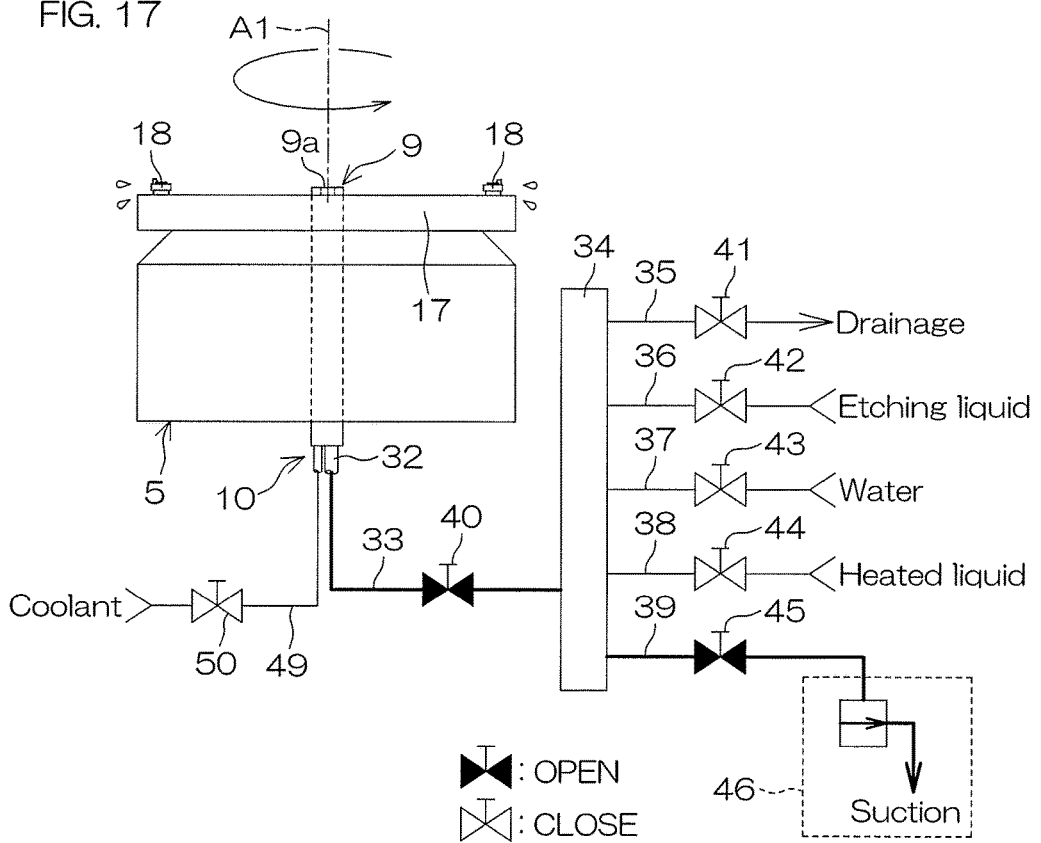
FIG. 17 is a drawing for describing a second drying step shown in FIG. 15.

FIG. 15 is a flowchart for describing a piping cooling step (S3) executed on the basis of the post-recipe POST 1. FIG. 16 is a drawing for describing a second coolant circulation step (Q1). FIG. 17 is a drawing for describing a second drying step (Q2). The piping cooling step (S3) will be described with reference to FIG. 1, FIG. 2, FIG. 4, FIG. 6 and FIG. 15. FIG. 16 and FIG. 17 will be referred to, whenever necessary.

The piping cooling step (S3) is executed after the substrate W has been carried out from each of the chambers 4. In the piping cooling step (S3), the controller 3 executes at first the second coolant circulation step (Q1).

Specifically, as shown in FIG. 16, the controller 3 opens the second water valve 43 and the common valve 40 while closing other valves of the lower surface supplying unit 10. Thereby, water at a normal temperature is fed to the third common piping 34, the second common piping 33 and the first common piping 32. The water at a normal temperature is circulated through the third common piping 34, the second common piping 33 and the first common piping 32, fed to the lower surface nozzle 9 and discharged upward from the discharge port 9a.

Where the temperature of the pipe wall of each of the first to the third common piping 32 to 34 is higher than a normal temperature (for example, about 24° C.), water at a normal temperature is circulated, by which the pipe wall of each of the first to the third common piping 32 to 34 is lowered in temperature. The water at a normal temperature is supplied to the lower surface nozzle 9 at a flow rate of about 0.4 (liters per minute), and the water is supplied, for example, for about 170 seconds. It is, thereby, possible to lower the temperature of the pipe wall of each of the first to the third common piping 32 to 34 down to a normal temperature.

After the elapse of a predetermined period of time from the start of supplying water (about 170 seconds), the controller 3 closes the second water valve 43 and the common valve 40 to stop circulation of water through the first to the third common piping 32 to 34.

The second coolant circulation step (Q1) is a step in which water at a normal temperature is supplied all of the three of the first to the third common piping 32 to 34 and, therefore, all of the first to the third common piping 32 to 34 can be effectively lowered in temperature.

Next, the controller 3 starts to execute the second drying step (Q2). Specifically, the controller 3 controls the spin motor 15 to start rotation of the spin base 17, as shown in FIG. 17, accelerating rotation of the spin base 17 to a drying rotational speed (for example, several thousand rotations per minute) greater than the rotational speed from the etching step (E3) to the substitution step (E5), thereby rotating the spin base 17 at the drying rotational speed. Thereby, a great centrifugal force is applied to the water on the spin base 17, and the water adhered on the upper surface of the spin base 17 is separated and scattered around the substrate W. In this way, water is removed from the spin base 17 to dry the spin base 17.

After the elapse of a predetermined period of time from the start of high-speed rotation of the substrate W, the controller 3 controls the spin motor 15 to stop rotation of the substrate W by the spin chuck 5. Then, the piping cooling step (S3) is completed.

The piping cooling step (S3) is able to reset heat accumulated in the common piping 32 to 34 during the common etching processing (S2) and the piping heating step (S1). Therefore, where other processing (for example, a process specified by the process recipe PROCESS 2) is executed after the common etching processing applied to one lot of substrates W, the other processing can be executed while thermal effects from the plurality of common etching processings (S2) are avoided.

Figure 18:
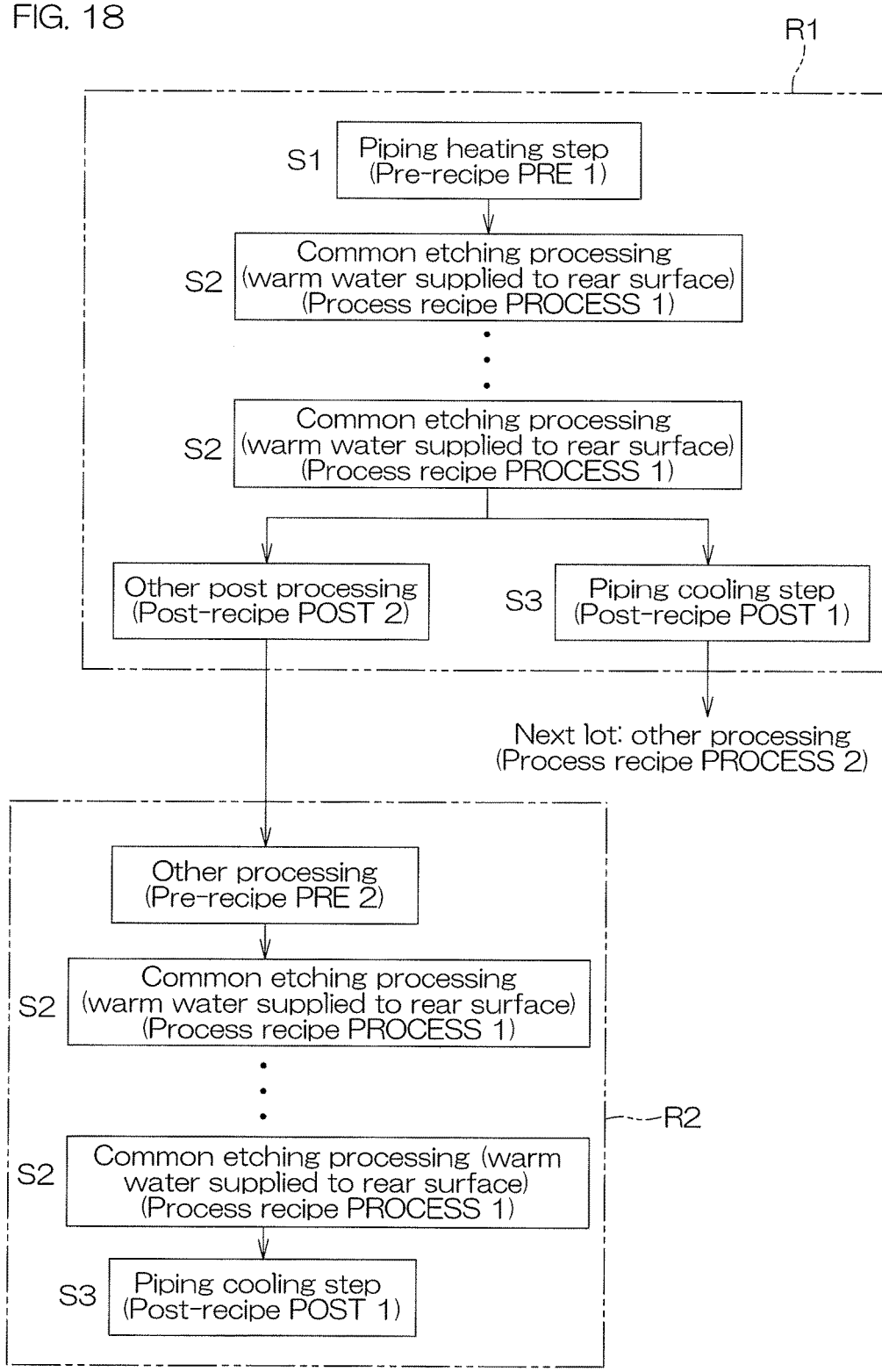
FIG. 18 is a flowchart for describing processing contents executed in the processing unit.

FIG. 18 is a flowchart for describing processing contents executed by the processing unit 2.

In the substrate processing apparatus 1, consideration is given to a case where following a plurality of substrates W which constitute a current lot R1, a plurality of substrates W which constitute a next lot R2 are carried into and the common etching processing is applied to the plurality of substrates W.

In this case, where the common etching processing (S2) is executed not only for the plurality of substrates W which constitute the lot R1 which has been already carried into the substrate processing apparatus 1 but also for the plurality of substrates W which constitute the next lot R2, as shown in FIG. 18, the piping cooling step (S3) executed in the current lot R1 is cancelled and the piping heating step (S1) executed in the next lot R2 is also cancelled.

Therefore, it is possible to keep a liquid temperature of an etching liquid at the thermal equilibrium temperature TB from the etching step (E3) of the next lot R2 according to the initial common etching processing (S2). That is, thereby, the etching processing can be applied to the next lot R2 of the plurality of substrates W at the same etching rate.

On the other hand, where etching processing (other processing) different from the common etching processings (S2) is executed for the plurality of substrates W which constitute the next lot R2, the piping cooling step (S3) executed in the current lot R1 is not cancelled.

As described so far, according to this preferred embodiment, of the plurality of common etching processings (S2) executed for each of the processing units 2, before the initial common etching processing (S2), the pipe wall of each of the common piping 32 to 34 is raised in temperature up to the thermal equilibrium temperature TB. Further, after each of the substitution steps (E5) and before each of the next etching steps (E3), the pipe wall of each of the common piping 32 to 34 will not be lowered in temperature.

Since the pipe wall of each of the common piping 32 to 34 is raised in temperature up to the thermal equilibrium temperature TB before the initial common etching processing (S2), it is possible to etch a substrate W by using an etching liquid at the thermal equilibrium temperature TB from the etching step (E3) according to the initial common etching processing (S2). Then, heat accumulation in the common piping 32 to 34 during the substitution step (E5) according to the common etching processing (S2) makes it possible to keep a liquid temperature of the etching liquid used in the etching step (E3) according to the subsequent common etching processing (S2) at the thermal equilibrium temperature TB. That is, it is possible to keep constant a liquid temperature of the etching liquid used in the etching step (E3) according to each common etching processing (S2). Thereby, etching processing can be applied to a plurality of substrates W at the same etching rate in each etching step (E3). Therefore, it is possible, to suppress or prevent a variation in etching processing between the substrates W.

In a conventional method in which the pipe wall of each of the common piping 32 to 34 is raised in temperature before each common etching processing (S2) and the pipe wall of each of the common piping 32 to 34 is also lowered in temperature after each common etching processing (S2), there is a possibility that time is needed to raise and lower the temperature of the pipe wall of each of the common piping 32 to 34, resulting in a lower throughput.

In contrast thereto, in this preferred embodiment, throughput can be improved because, of the plurality of common etching processings (S2), before the initial common etching processing (S2), only a one-time rise in temperature of the pipe wall of each of the common piping 32 to 34 will be sufficient.

Further, of the plurality of common etching processings (S2), after the last common etching processing (S2), the piping cooling step (S3) is executed. Since the pipe wall of each of the common piping 32 to 34 is lowered in temperature (the first temperature) after the last common etching processing (S2), it is possible to reset heat accumulated in the common piping 32 to 34 during the common etching processing (S2). Thereby, it is possible to execute next processing of the plurality of common etching processings (S2) while thermal effects from the piping heating step according to the plurality of common etching processings (S2) are avoided, and the next processing can be favorably executed.

Further, in the previously described preferred embodiment, the high-temperature liquid used in the substitution step (E5) is supplied as a heated liquid to the common piping 32 to 34 to execute the heated-liquid circulation step. Therefore, as compared with a case where a heated liquid different from the high-temperature liquid is used in the heated-liquid circulation step, it is possible to omit a piping configuration of the heated liquid and others.

Although a description has been so far given of one preferred embodiment of the present invention, the present invention can be executed in other preferred embodiments.

In the previously described preferred embodiment, for example, in the temperature adjusting steps (P2. P3) of the piping heating step (S1), there is adopted a method in which the pipe wall of each of the common piping 32 to 34 is cooled by using the external cooling step and the first coolant circulation step. However, cooling may be executed by using the second coolant circulation step.

Further, in the piping heating step (S1), a description has been given of a method in which the pipe wall of each of the common piping 32 to 34 which has been raised in temperature up to a predetermined raised temperature in the temperature adjusting steps (P2, P3) is lowered in temperature in two stages down to the thermal equilibrium temperature TB. However, the pipe wall of each of the common piping 32 to 34 which has been raised in temperature up to a predetermined raised temperature only in a single stage, that is, only by one temperature adjusting step, maybe lowered in temperature in two stages down to the thermal equilibrium temperature TB.

Further, in the previously described preferred embodiment, a heated liquid different from the high-temperature liquid used in the substitution step (E5), that is, a heated liquid lower in temperature than the heated liquid in question and higher than a normal temperature (the first liquid temperature) is circulated through the common piping 32 to 34, by which the pipe wall of each of the common piping 32 to 34 may be lowered in temperature in two stages down to the thermal equilibrium temperature TB.

Further, in the piping heating step (S1), the temperature adjusting steps (P2, P3) may not be provided. That is, the temperature of the pipe wall of each of the common piping 32 to 34 may be adjusted by the heating step (P1) directly to the thermal equilibrium temperature TB. In this case, a heated liquid different from the high-temperature liquid used in the substitution step (E5), that is, a heated liquid lower in temperature than the heated liquid in question and higher than a normal temperature (the first liquid temperature) is circulated through the common piping 32 to 34, by which the pipe wall of each of the common piping 32 to 34 may be lowered in temperature in two stages down to the thermal equilibrium temperature TB.

Further, in the piping heating step (S1), the pipe wall of each of the common piping 32 to 34 may be raised in temperature by an external heat source without circulation of the heated liquid through the common piping 32 to 34.

Further, even if the temperature of the pipe wall of each of the common piping 32 to 34 before the start of the common etching processing (S2) is found, from results of the piping heating step (S1), unequal to the thermal equilibrium temperature TB, the liquid temperature may be approximate to the thermal equilibrium temperature TB.

Further, the liquid temperature (first liquid temperature) of the etching liquid supplied from the second etching liquid piping 36 to the common piping 32 to 34 may not be a normal temperature. In this case, the thermal equilibrium temperature thereof is set to be higher than the previously described thermal equilibrium temperature TB.

Further, in the piping cooling step (S3), a description has been given of a method in which the pipe wall of each of the common piping 32 to 34 is cooled by using the second coolant circulation step. As the piping cooling step (S3), the external cooling step and/or the first coolant circulation step may be executed together with the second coolant circulation step, or the external cooling step and/or the first coolant circulation step may be executed in place of the second coolant circulation step.

Further, the piping cooling step (S3) may be eliminated. In this case, the pipe wall of each of the common piping 32 to 34 can be lowered in temperature by being allowed to stand for a predetermined period of time after completion of the common etching processing (S2).

Further, in the previously described first and second coolant circulation steps, a description has been given of an example in which the temperature of the coolant is a normal temperature. However, the coolant may have a liquid temperature lower than a normal temperature.

Further, a description has been given of a case that the nozzle is the lower surface nozzle 9 which supplies a liquid to the lower surface of the substrate W. However, the present invention may be applied to supply piping which is connected to the upper surface nozzle for supplying a liquid to the upper surface of the substrate W.

Further, the high-temperature liquid discharge step according to the present invention shall not be limited to the substitution step (S5, a step in which a temperature-adjusted liquid having a high temperature is supplied to the lower surface of the substrate W), but it is widely applicable to a configuration in which a high-temperature liquid is discharged from the nozzle to a substrate. For example, rear-surface rinse steping in which a rinse liquid having a liquid temperature higher than a normal temperature is supplied to a substrate W may be a high-temperature liquid discharge step according to the present invention.

The substrate processing apparatus 1 is not limited to an apparatus that processes a circular-plate shaped substrate W but may be an apparatus which processes a polygonal substrate W.

While preferred embodiments of the present invention have been described in detail, it should be understood that these embodiments are merely illustrative of the technical principles of the present invention but not limitative of the invention. The scope of the present invention are to be limited only by the appended claims.

This present application corresponds to Japanese Patent Application No. 2016-237804 filed in the Japan Patent Office on Dec. 7, 2016, and the entire disclosure of this application is incorporated herein by reference.

What is claimed is:

1. A substrate processing method which is executed by a substrate processing apparatus which includes a nozzle for supplying a liquid to a substrate held by a substrate holding unit and common piping connected to the nozzle and which applies sequentially common etching processing which is common to each of the plurality of substrates, wherein
the common etching processing has an etching step in which an etching liquid at a first liquid temperature is supplied to the common piping to discharge the etching liquid from the nozzle, thereby etching the substrate held by the substrate holding unit and a high-temperature liquid discharge step in which a high-temperature liquid having a liquid temperature higher than the first liquid temperature is supplied after the etching step to the common piping to discharge the high-temperature liquid from the nozzle,
the substrate processing method which further includes a piping heating step in which, of the plurality of common etching processings applied to the plurality of substrates, before initial common etching processing, a pipe wall of the common piping is raised in temperature up to a predetermined second liquid temperature higher than the first liquid temperature, wherein
in each of the common etching processings, after each of the high-temperature liquid discharge steps and before each of next etching steps, there is not performed a step which lowers the temperature of the pipe wall of each of the common piping.

2. The substrate processing method according to claim 1, wherein the substrate processing apparatus further includes a recipe storage portion for storing a process recipe which specifies processing contents applied to a substrate and a pre-recipe which is executed prior to the process recipe,
a first recipe corresponding to the common etching processing and a second recipe corresponding to the piping heating step are stored respectively as the process recipe and the pre-recipe at the recipe storage portion, and
the common etching processing is executed on the basis of the first recipe and the piping heating step is executed on the basis of the second recipe.

3. The substrate processing method according to claim 1, wherein the common etching processing is a process which is executed for each of a plurality of substrates which constitute one lot.

4. The substrate processing method according to claim 3 in which, following the plurality of substrates which constitute the one lot, a plurality of substrates which constitute a next lot are processed by the substrate processing apparatus, wherein
where the common etching processing is executed for the plurality of substrates which constitute the one lot and the common etching processing is also executed for the plurality of substrates which constitute the next lot, the piping heating step is not applied to the next lot.

5. The substrate processing method according to claim 3 which further includes a piping cooling step in which, of the plurality of common etching processings applied to the plurality of substrates, after the last common etching processing, the common piping is cooled, by which the pipe wall of the common piping is lowered in temperature, wherein
following the plurality of substrates which constitute the one lot, a plurality of substrates which constitute a next lot are processed by the substrate processing apparatus, and
where the common etching processing is executed for the plurality of substrates which constitute the one lot and the common etching processing is also executed for the plurality of substrates which constitute the next lot, the piping cooling step is not performed for the one lot.

6. The substrate processing method according to claim 1, wherein the second liquid temperature is a temperature of the pipe wall of the common piping and a thermal equilibrium temperature which will converge upon continuous execution of the common etching processing by the substrate processing apparatus.

7. The substrate processing method according to claim 1, wherein the piping heating step includes a heated-liquid circulation step in which a heated liquid having a temperature equal to the second liquid temperature or higher than the second liquid temperature is circulated through the common piping so that the common piping can be heated.

8. The substrate processing method according to claim 1, wherein the piping heating step includes a heating step which heats the common piping so that the pipe wall of the common piping can be raised in temperature higher than the second liquid temperature and a temperature adjusting step which cools the common piping after the heating step, thereby adjusting a temperature of the common piping to the second liquid temperature.

9. The substrate processing method according to claim 1 which further includes a piping cooling step in which, of the plurality of common etching processings applied to the plurality of substrates, after the last common etching processing, the common piping is cooled, by which the pipe wall of the common piping is lowered in temperature.

10. The substrate processing method according to claim 9, wherein
the substrate processing apparatus includes a recipe storage portion for storing a process recipe which specifies processing contents applied to a substrate, a pre-recipe which is executed prior to the process recipe and a post-recipe which is executed after the process recipe,
a first recipe corresponding to the common etching processing, a second recipe corresponding to the piping heating step and a third recipe corresponding to the piping cooling step are stored respectively as the process recipe, the pre-recipe and the post-recipe at the recipe storage portion, and
the common etching processing is executed on the basis of the first recipe, the piping heating step is executed on the basis of the second recipe and the piping cooling step is also executed on the basis of the third recipe.

11. The substrate processing method according to claim 9, wherein the piping cooling step includes a coolant circulation step which circulates a coolant having a temperature lower than the second liquid temperature through the common piping so that the common piping can be cooled.

12. The substrate processing method according to claim 9, wherein the piping cooling step includes an external cooling step which cools the common piping from the exterior so that the common piping can be cooled.

* * * * *